United States Patent
Miki

(10) Patent No.: US 12,482,734 B2
(45) Date of Patent: Nov. 25, 2025

(54) LAMINATED WIRING BOARD

(71) Applicant: SHINKO ELECTRIC INDUSTRIES CO., LTD., Nagano (JP)

(72) Inventor: Shota Miki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 144 days.

(21) Appl. No.: 18/331,625

(22) Filed: Jun. 8, 2023

(65) Prior Publication Data

US 2023/0411264 A1    Dec. 21, 2023

(30) Foreign Application Priority Data

Jun. 15, 2022    (JP) .................................. 2022-096864

(51) Int. Cl.
*H01L 23/49*    (2006.01)
*H01L 21/48*    (2006.01)
*H01L 23/498*    (2006.01)

(52) U.S. Cl.
CPC .... *H01L 23/49833* (2013.01); *H01L 21/4846* (2013.01); *H01L 23/49822* (2013.01); *H01L 23/49838* (2013.01)

(58) Field of Classification Search
CPC ...... H05K 1/144; H05K 2201/04; H05K 1/14; H05K 1/141; H05K 3/46; H01L 23/5385; H01L 25/0657
USPC ......................................................... 174/253
See application file for complete search history.

(56) References Cited

U.S. PATENT DOCUMENTS

| | | | |
|---|---|---|---|
| 2001/0028104 A1* | 10/2001 | Fukatsu | H01L 25/0657 257/692 |
| 2004/0118596 A1 | 6/2004 | Fuller, Jr. et al. | |
| 2006/0087029 A1* | 4/2006 | Imanaka | H01L 23/49822 257/723 |
| 2010/0252304 A1* | 10/2010 | Muramatsu | H01L 23/3121 174/251 |
| 2010/0258931 A1* | 10/2010 | Yoshida | H01L 25/0657 257/692 |
| 2015/0036305 A1* | 2/2015 | Nanjo | H01L 24/19 29/830 |
| 2015/0245473 A1* | 8/2015 | Shimizu | H05K 1/113 29/850 |
| 2016/0329304 A1 | 11/2016 | Hatakeyama et al. | |

FOREIGN PATENT DOCUMENTS

| | | |
|---|---|---|
| JP | 2004-200689 | 7/2004 |
| WO | 2014/181766 | 11/2014 |

* cited by examiner

*Primary Examiner* — Timothy J Thompson
*Assistant Examiner* — Sidi M Maiga
(74) *Attorney, Agent, or Firm* — IPUSA, PLLC

(57) ABSTRACT

A laminated wiring board includes a first wiring board, a plurality of second wiring boards disposed side by side and laminated on the first wiring board, a third wiring board laminated on the plurality of second wiring boards, a first insulating resin layer disposed between the first wiring board and the plurality of second wiring boards, and a second insulating resin layer disposed between the plurality of second wiring boards and the third wiring board.

17 Claims, 23 Drawing Sheets

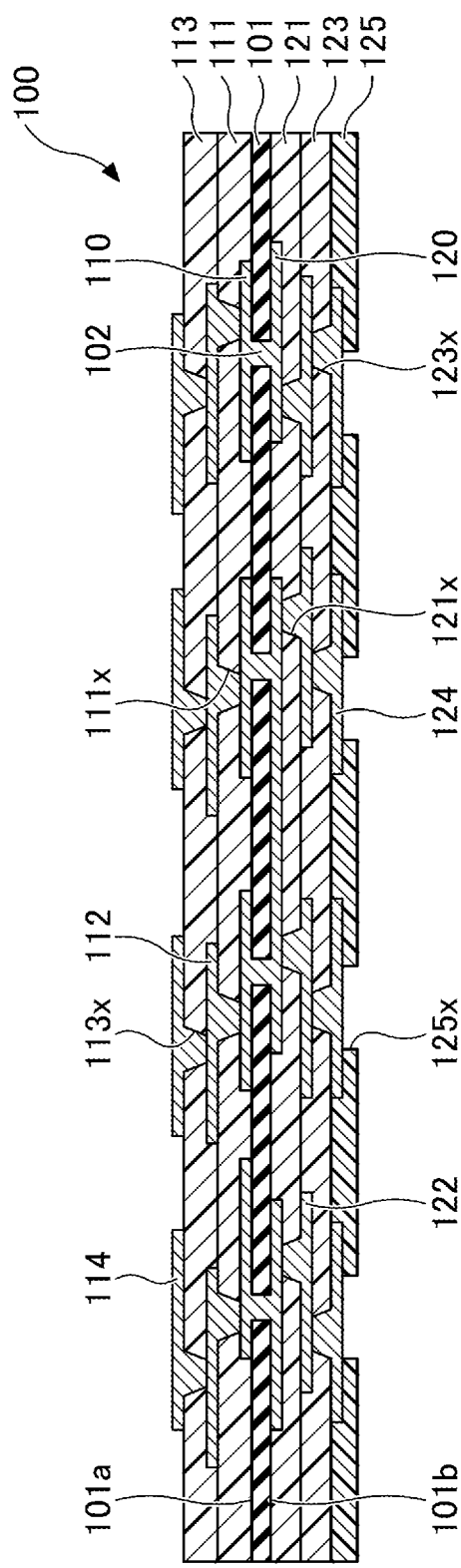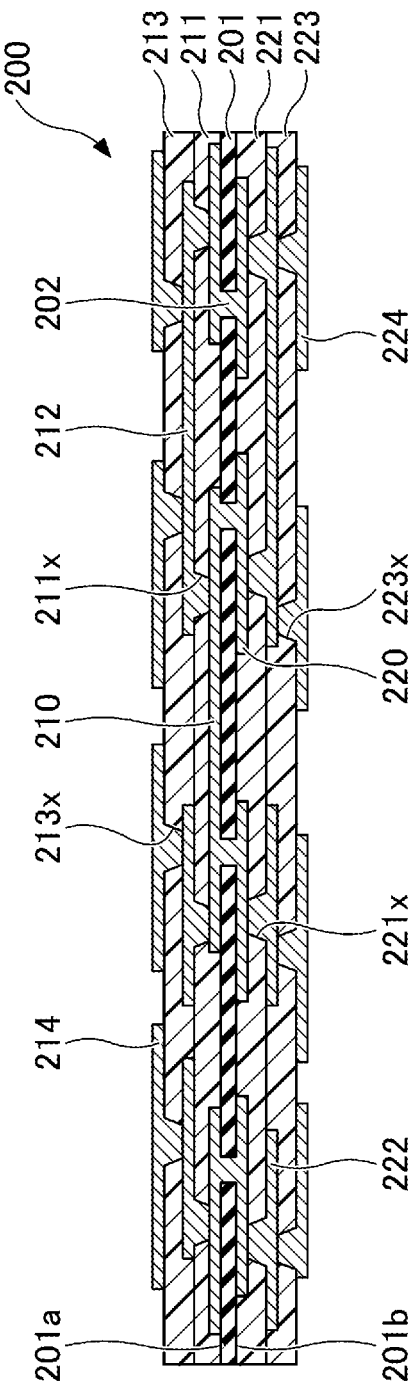

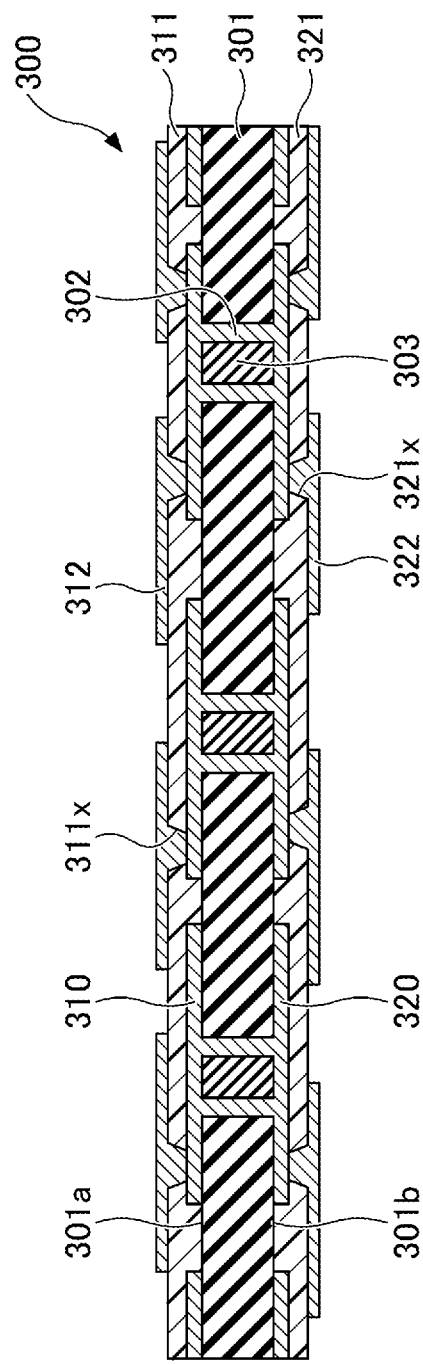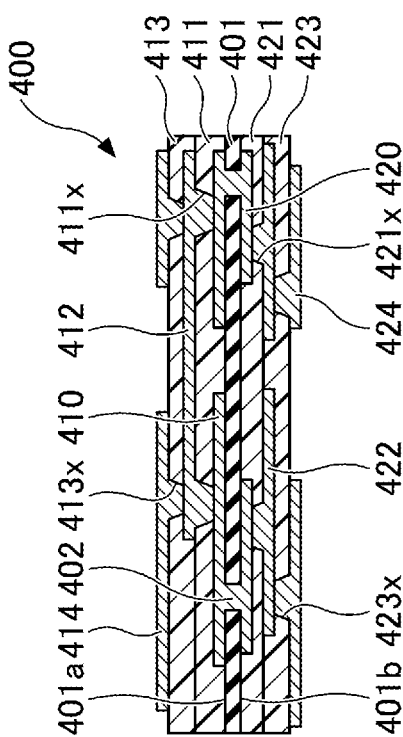

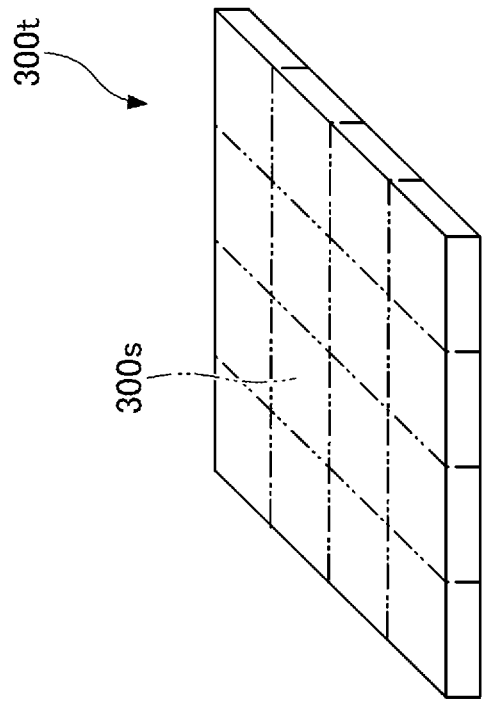
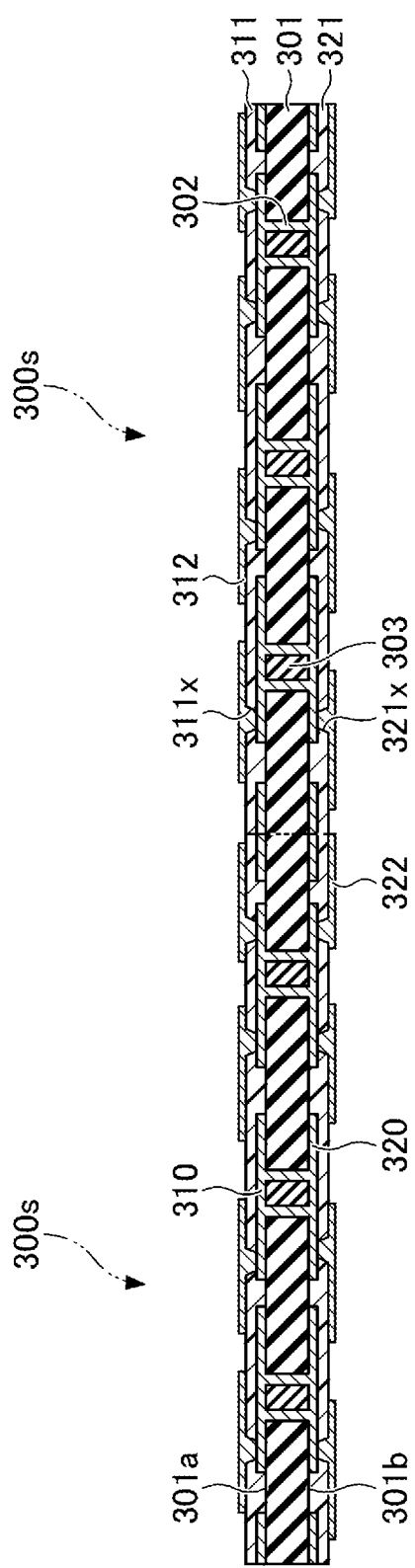

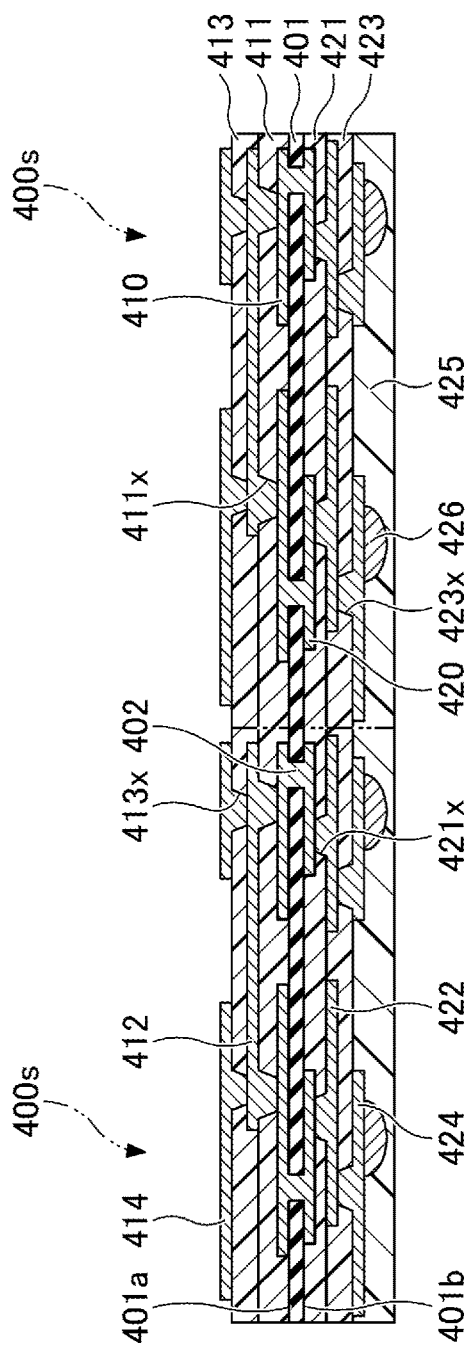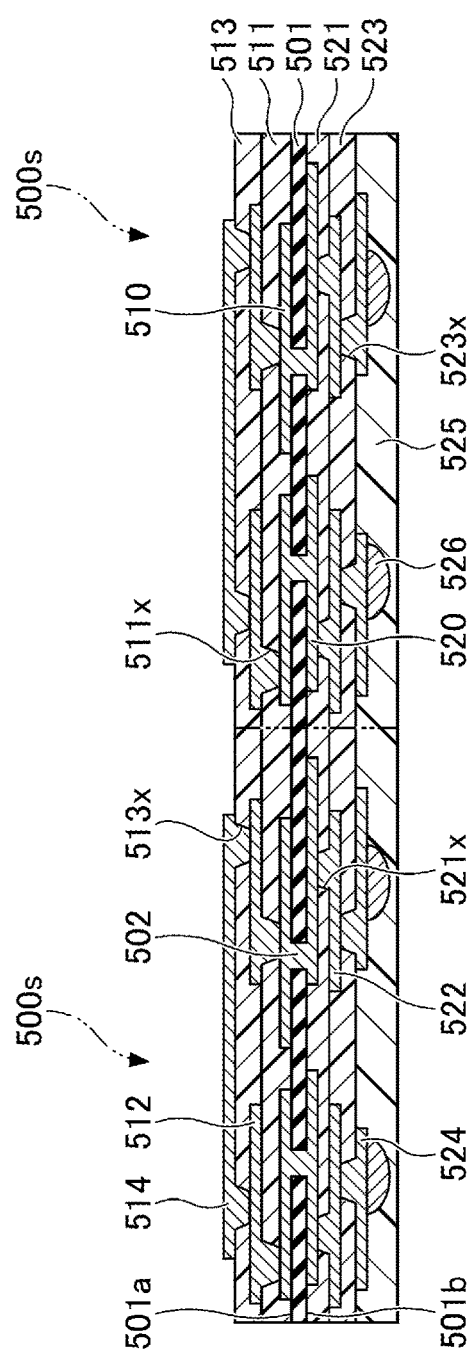

LAMINATED WIRING BOARD

CROSS-REFERENCE TO RELATED APPLICATIONS

This application is based upon and claims priority to Japanese Patent Application No. 2022-096864, filed on Jun. 15, 2022, the entire contents of which are incorporated herein by reference.

FIELD

Certain aspects of the embodiments discussed herein are related to laminated wiring boards, and methods for manufacturing laminated wiring boards. The laminated wiring board is sometimes also referred to as a multilayer wiring board.

BACKGROUND

A known wiring board includes a plurality of interconnect layers formed on two mutually opposite surfaces of a core layer, for example.

Examples of the wiring board are proposed in Japanese Laid-Open Patent Publication No. 2004-200689, and International Publication Pamphlet No. WO 2014/181766 A1, for example.

As the size of the wiring board increases and the number of interconnect layers included in the wiring board increases, the yield of the wiring board may deteriorate.

SUMMARY

Accordingly, it is an object in one aspect of embodiments to provide a laminated wiring board and a method for manufacturing the laminated wiring board, which can reduce deterioration of the yield.

According to one aspect of the embodiments, a laminated substrate includes a first wiring board; a plurality of second wiring boards disposed side by side and laminated on the first wiring board; a third wiring board laminated on the plurality of second wiring boards; a first insulating resin layer disposed between the first wiring board and the plurality of second wiring boards; and a second insulating resin layer disposed between the plurality of second wiring boards and the third wiring board.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 3A and FIG. 3B are cross sectional views (part 1) illustrating examples of wiring boards;

FIG. 4A and FIG. 4B are cross sectional views (part 2) illustrating examples of wiring boards;

FIG. 8A and FIG. 8B are diagrams (part 3) illustrating the example of the method for manufacturing the laminated wiring board according to the first embodiment;

FIG. 13A and FIG. 13B are diagrams (part 8) illustrating the example of the method for manufacturing the laminated wiring board according to the first embodiment;

DESCRIPTION OF EMBODIMENTS

Figure 1:
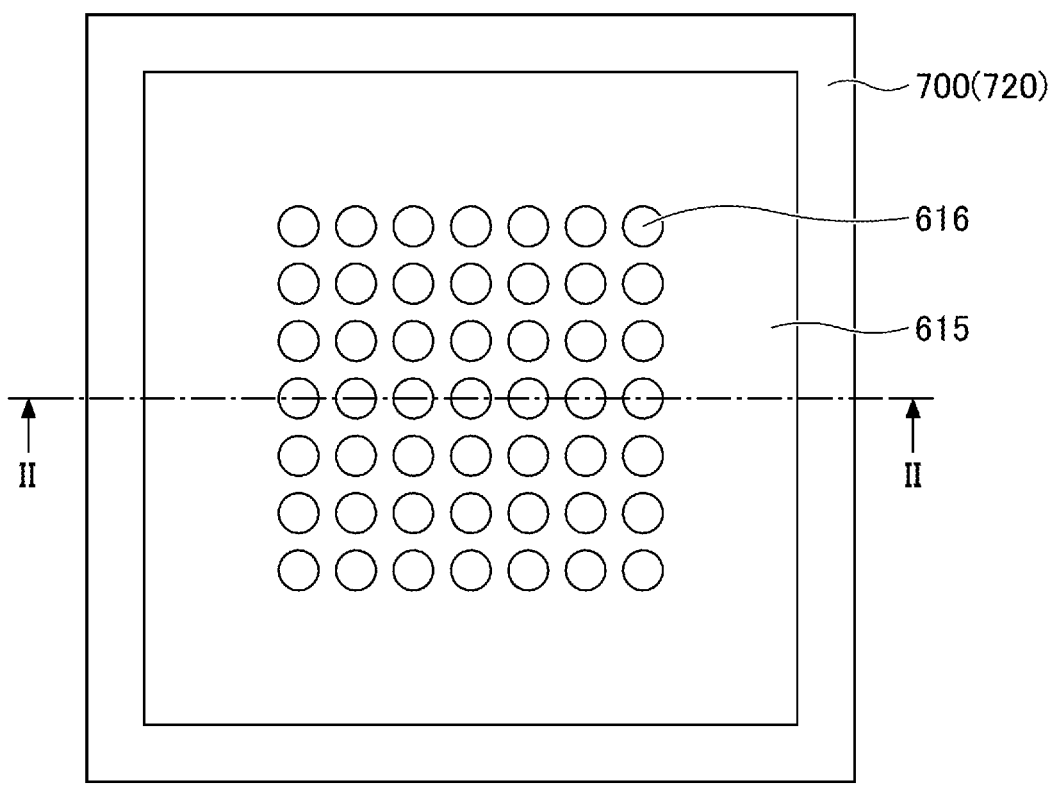
FIG. 1 is a top view illustrating an example of a laminated wiring board according to a first embodiment.

Preferred embodiments of the present invention will be described with reference to the accompanying drawings. In the drawings, constituent elements having substantially the same functional configuration are designated by the same reference numerals, and a redundant description thereof may be omitted.

First Embodiment

<Configuration of Laminated Wiring Board>

Figure 2:
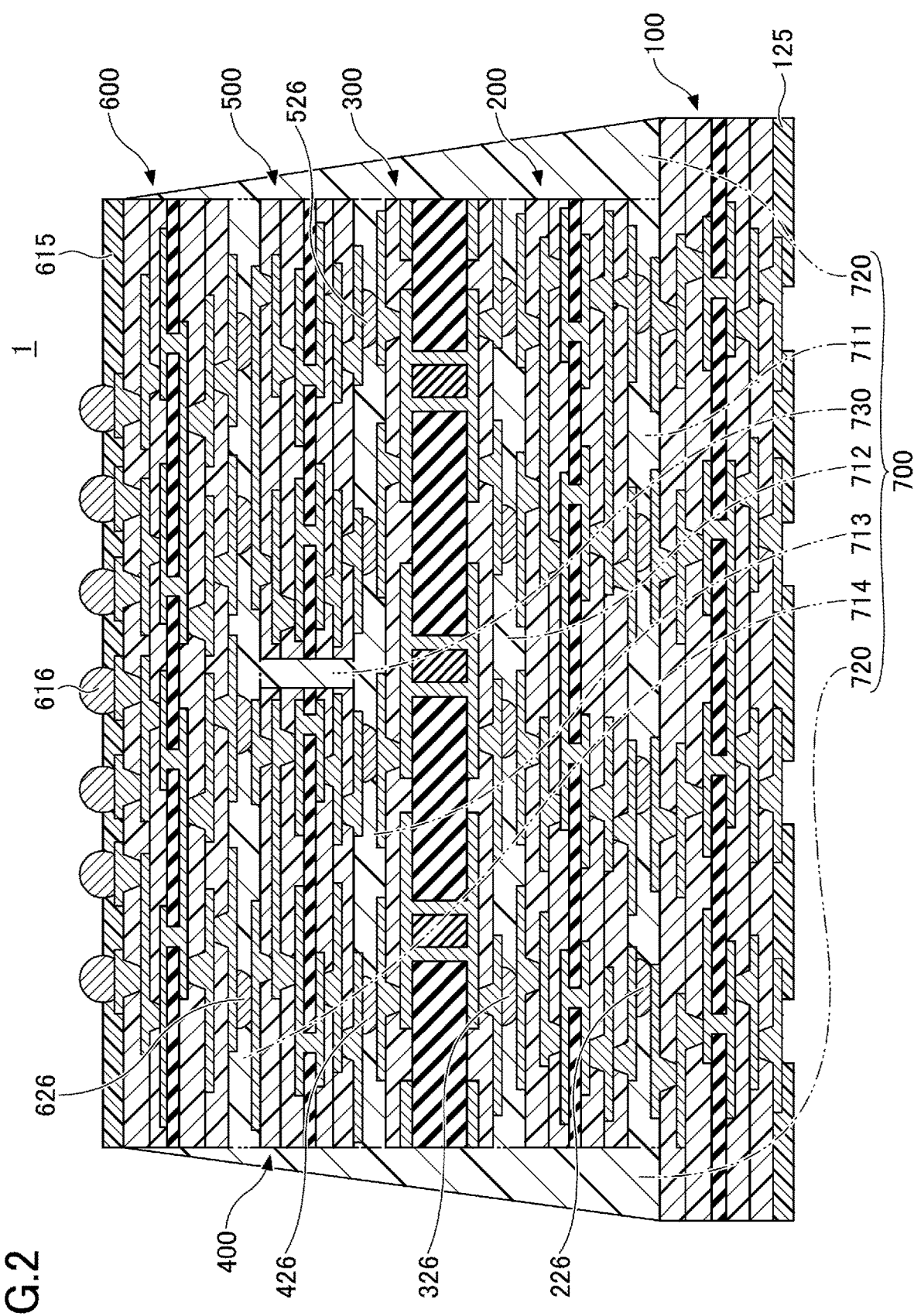
FIG. 2 is a cross sectional view illustrating the example of the laminated wiring board according to the first embodiment.

First, a configuration of a laminated wiring board according to a first embodiment will be described. FIG. 1 is a top view illustrating an example of the laminated wiring board according to the first embodiment. FIG. 2 is a cross sectional view illustrating the example of the laminated wiring board according to the first embodiment. FIG. 2 corresponds to a cross sectional view along a line II-II in FIG. 1.

As illustrated in FIG. 1 and FIG. 2, a laminated wiring board 1 according to the first embodiment includes a wiring board 100, a wiring board 200, a wiring board 300, a wiring board 400, a wiring board 500, a wiring board 600, and an insulating resin layer 700. The wiring boards 200 and 300 are laminated in this order on the wiring board 100. The wiring boards 400 and 500 are arranged side by side and laminated on the wiring board 300. The wiring board 600 is laminated on the wiring boards 400 and 500.

In the present embodiment, for the sake of convenience, a side on which the wiring board 600 is located when viewed from the wiring board 100 is referred to as an upper side or one side, and a side on which the wiring board 100 is located when viewed from the wiring board 600 is referred to as a lower side or the other side. In addition, a surface of each portion on the side closer to the wiring board 600 than to the wiring board 100 is referred to as an upper surface or one surface, and a surface of each portion on the side closer to the wiring board 100 than to the wiring board 600 is referred to as a lower surface or the other surface. However, the laminated wiring board 1 can be used in an upside-down state, or can be used in a state inclined at an arbitrary angle. A plan view of an object refers to a view of the object in a normal direction to the upper surface of the wiring board 600, and a planar shape of the object refers to a shape of the object in the plan view viewed in the normal direction to the upper surface of the wiring board 600.

The planar shape of each of the wiring boards 100, 200, 300, 400, 500, and 600 is a rectangular shape, for example. In the plan view, the lengths of corresponding sides of the wiring boards 200, 300, and 600 are approximately the same. On the other hand, the lengths of sides of the wiring board 100 are longer than the lengths of the corresponding sides of the wiring boards 200, 300, and 600. The lengths of a first pair of mutually parallel sides of the wiring board 400 are shorter than the lengths of the corresponding sides of the wiring boards 200, 300, and 600, and the lengths of the other, second pair of mutually parallel sides of the wiring board 400 are shorter than or equal to the lengths of the corresponding sides of the wiring boards 200, 300, and 600. The lengths of a first pair of mutually parallel sides of the wiring board 500 are shorter than the lengths of the corresponding sides of the wiring boards 200, 300, and 600, and the lengths of the other, second pair of mutually parallel sides of the wiring board 500 are shorter than or equal to the lengths of the corresponding sides of the wiring boards 200, 300, and 600.

The wiring board 200 is provided on the wiring board 100. The laminated wiring board 1 has a plurality of conductive bonding materials 226, and the wiring boards 100 and 200 are mechanically bonded to each other by the conductive bonding materials 226. The wiring boards 100 and 200 are electrically connected to each other through the conductive bonding materials 226. The conductive bonding materials 226 include solder, for example. Examples of the solder material include lead-free solder, such as tin-silver-based (SnAg-based) alloys, tin-zinc-based (SnZn-based) alloys, tin-copper-based (SnCu-based) alloys or the like, and lead-containing solder, such as lead-tin-based (PbSn-based) alloy, for example.

The wiring board 300 is provided on the wiring board 200. The laminated wiring board 1 has a plurality of conductive bonding materials 326, and the wiring boards 200 and 300 are mechanically bonded to each other by the conductive bonding materials 326. The wiring boards 200 and 300 are electrically connected to each other through the conductive bonding materials 326. A material used for the conductive bonding materials 326 may be the same as the material used for the conductive bonding materials 226, for example.

The wiring boards 400 and 500 are provided on the wiring board 300. The wiring boards 400 and 500 are arranged side by side in a direction parallel to the upper surface of the wiring board 300. The laminated wiring board 1 has a plurality of conductive bonding materials 426, and the wiring boards 300 and 400 are mechanically bonded to each other by the conductive bonding materials 426. The wiring boards 300 and 400 are electrically connected to each other through the conductive bonding materials 426. The laminated wiring board 1 has a plurality of conductive bonding materials 526, and the wiring boards 300 and 500 are mechanically bonded to each other by the conductive bonding materials 526. The wiring boards 300 and 500 are electrically connected to each other through the conductive bonding materials 526. Materials used for the conductive bonding materials 426 and 526 may be the same as the material used for the conductive bonding materials 226, for example.

The wiring board 600 is provided on the wiring boards 400 and 500. The laminated wiring board 1 has a plurality of conductive bonding materials 626. The wiring boards 400 and 600 are mechanically bonded to each other by a part of the conductive bonding materials 626, and the wiring boards 500 and 600 are mechanically bonded to each other by another part of the conductive bonding materials 626. The wiring boards 400 and 600 are electrically connected to each other through a part of the conductive bonding materials 626, and the wiring boards 500 and 600 are electrically connected to each other through another part of the conductive bonding materials 626. A material used for the conductive bonding materials 626 may be the same as the material used for the conductive bonding materials 226, for example.

In the plan view, outer edges of the wiring boards 200, 300, and 600 overlap each other, and a part of outer edges of the wiring boards 400 and 500 overlaps the outer edges of the wiring boards 200, 300, and 600. Further, in the plan view, the outer edges of the wiring boards 200, 300, 400, 500, and 600 are located inside an outer edge of the wiring board 100. In the plan view, a part of the upper surface of the wiring board 100 is exposed in an annular shape from the wiring boards 200, 300, 400, 500, and 600. The wiring boards 200 and 300 are an example of a first wiring board, the wiring boards 400 and 500 are an example of a second wiring board, the wiring board 600 is an example of a third wiring board, and the wiring board 100 is an example of a fourth wiring board.

Figure 5A:
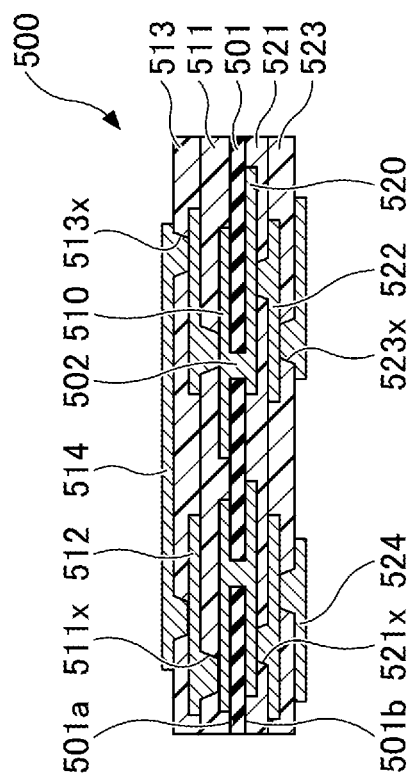
FIG. 5A and FIG. 5B are cross sectional views (part 3) illustrating an example of wiring boards.
Figure 5B:
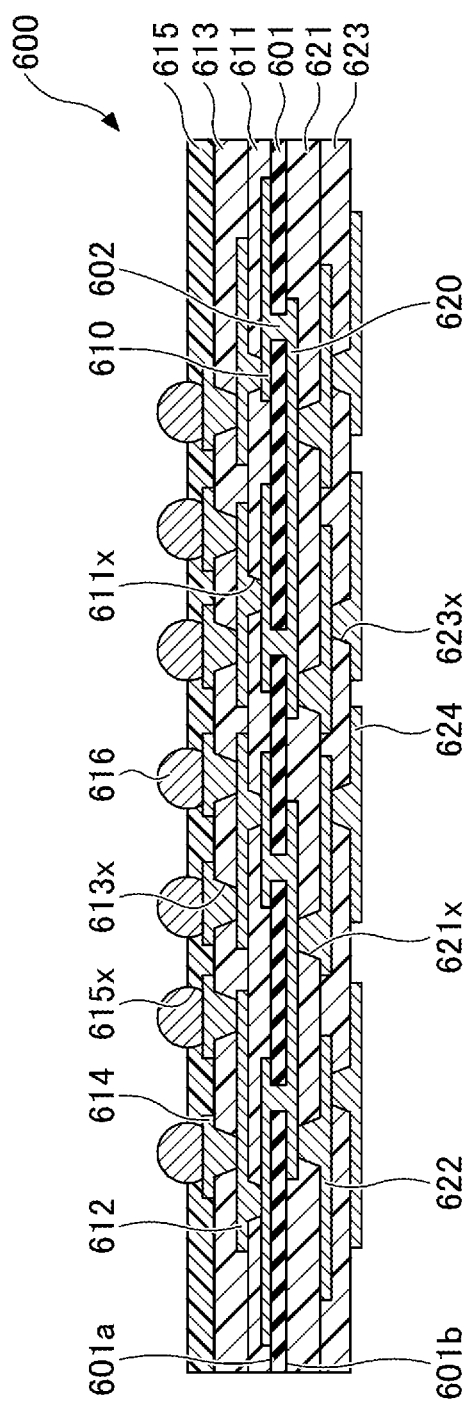

Next, the wiring boards 100, 200, 300, 400, 500, and 600 will be described in more detail. FIG. 3A and FIG. 3B are cross sectional views illustrating examples of the wiring boards 100 and 200. FIG. 4A and FIG. 4B are cross sectional views illustrating examples of the wiring boards 300 and 400. FIG. 5A and FIG. 5B are cross sectional views illustrating examples of the wiring boards 500 and 600.

As illustrated in FIG. 3A, the wiring board 100 includes an interconnect layer 110, an insulating layer 111, an interconnect layer 112, an insulating layer 113, and an interconnect layer 114 that are successively laminated on one surface 101a of a core layer 101. The wiring board 100 also includes an interconnect layer 120, an insulating layer 121, an interconnect layer 122, an insulating layer 123, an interconnect layer 124, and a solder resist layer 125 that are successively laminated on the other surface 101b of the core layer 101.

A so-called glass epoxy substrate in which a glass cloth is impregnated with an insulating resin, such as an epoxy-based resin or a polyimide-based resin, for example, may be used for the core layer 101. A substrate in which a woven fabric or a nonwoven fabric of glass fiber, carbon fiber, aramid fiber, or the like, is impregnated with an epoxy-based resin or the like, for example, may also be used for the core layer 101. The core layer 101 may not include the glass cloth or the like.

The interconnect layer 110 is formed on the one surface 101a of the core layer 101. The interconnect layer 110 is electrically connected to the interconnect layer 120 through via interconnects 102 penetrating the core layer 101. A material used for the interconnect layer 110 may be copper or the like, for example.

The insulating layer 111 is formed on the one surface 101a of the core layer 101, so as to cover the interconnect layer 110. A material used for the insulating layer 111 may be an insulating resin or the like including an epoxy-based resin or a polyimide-based resin as a main component thereof, for example. A thickness of the insulating layer 111 may be in a range of approximately 10 μm to approximately 50 μm, for example. The insulating layer 111 may include a filler, such as silica ($SiO_2$) or the like.

The interconnect layer 112 is formed on one surface of the insulating layer 111. The interconnect layer 112 includes via interconnects filling via holes 111x that penetrate the insulating layer 111 and expose the upper surface of the interconnect layer 110, and interconnect patterns formed on the upper surface of the insulating layer 111. The interconnect patterns of the interconnect layer 112 are electrically connected to the interconnect layer 110 through the via interconnects. Each via hole 111x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 110, for example. A material used for the interconnect layer 112 may be the same as the material used for the interconnect layer 110, for example.

The insulating layer 113 is formed on the upper surface of the insulating layer 111, so as to cover the interconnect layer 112. A material used for the insulating layer 113 and a thickness of the insulating layer 113 may be the same as those of the insulating layer 111, for example. The insulating layer 113 may include a filler, such as silica ($SiO_2$) or the like.

The interconnect layer 114 is formed on one surface of the insulating layer 113. The interconnect layer 114 includes via interconnects filling via holes 113x that penetrate the insulating layer 113 and expose the upper surface of the interconnect layer 112, and interconnect patterns formed on the upper surface of the insulating layer 113. The interconnect patterns of the interconnect layer 114 are electrically connected to the interconnect layer 112 through the via interconnects. Each via hole 113x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 112, for example. A material used for the interconnect layer 114 may be the same as the material used for the interconnect layer 110, for example.

The interconnect layer 120 is formed on the other surface 101b of the core layer 101. A material used for the interconnect layer 120 may be the same as the material used for the interconnect layer 110, for example.

The insulating layer 121 is formed on the other surface 101b of the core layer 101, so as to cover the interconnect layer 120. A material used for the insulating layer 121 and a thickness of the insulating layer 121 may be the same as those of the insulating layer 111, for example. The insulating layer 121 may include a filler, such as silica ($SiO_2$) or the like.

The interconnect layer 122 is formed on the other surface of the insulating layer 121. The interconnect layer 122 includes via interconnects filling via holes 121x that penetrate the insulating layer 121 and expose the lower surface of the interconnect layer 120, and interconnect patterns formed on the lower surface of the insulating layer 121. The interconnect patterns of the interconnect layer 122 are electrically connected to the interconnect layer 120 through the via interconnects. Each via hole 121x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 120, for example. A material used for the interconnect layer 122 may be the same as the material used for the interconnect layer 110, for example.

The insulating layer 123 is formed on the lower surface of the insulating layer 121, so as to cover the interconnect layer 122. A material used for the insulating layer 123 and a thickness of the insulating layer 123 may be the same as those of the insulating layer 111, for example. The insulating layer 123 may include a filler, such as silica ($SiO_2$) or the like.

The interconnect layer 124 is formed on the other surface of the insulating layer 123. The interconnect layer 124 includes via interconnects filling via holes 123x that penetrate the insulating layer 123 and expose the lower surface of the interconnect layer 122, and interconnect patterns formed on the lower surface of the insulating layer 123. The interconnect patterns of the interconnect layer 124 are electrically connected to the interconnect layer 122 through the via interconnects. Each via hole 123x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 122, for example. A material used for the interconnect layer 124 may be the same as the material used for the interconnect layer 110, for example.

The solder resist layer 125 is the outermost layer on the other surface of the wiring board 100, and is an insulating layer provided on the lower surface of the insulating layer 123 so as to cover the interconnect layer 124. The solder resist layer 125 may be formed of a photosensitive resin or the like, such as an epoxy-based resin, an acrylic-based resin, or the like, for example. A thickness of the solder resist layer 125 may be in a range of approximately 5 μm to approximately 40 μm, for example.

The solder resist layer 125 has openings 125x, and a part of the lower surface of the interconnect layer 124 is exposed at the bottom of the openings 125x. The planar shape of the openings 125x may be a circular shape, for example. The interconnect layer 124 exposed inside the openings 125x can be used as pads for making electrical connections to a mounting substrate, such as a motherboard or the like. A metallic layer may be formed on the lower surface of the interconnect layer 124 exposed inside the openings 125x, or the pads may be subjected to an anti-oxidation treatment, such as an organic solderability preservative (OSP) treatment or the like, as required.

As illustrated in FIG. 3B, the wiring board 200 includes an interconnect layer 210, an insulating layer 211, an interconnect layer 212, an insulating layer 213, and an interconnect layer 214 that are successively laminated on the one surface 201a of a core layer 201. The wiring board 200 also includes an interconnect layer 220, an insulating layer 221, an interconnect layer 222, an insulating layer 223, and an interconnect layer 224 that are successively laminated on the other surface 201b of the core layer 201.

A material used for the core layer 201 may be the same as the material used for the core layer 101, for example. The core layer 201 may not include the glass cloth or the like.

The interconnect layer 210 is formed on the one surface 201a of the core layer 201. The interconnect layer 210 is electrically connected to the interconnect layer 220 through via interconnects 202 penetrating the core layer 201. A material used for the interconnect layer 210 may be the same as the material used for the interconnect layer 110, for example.

The insulating layer 211 is formed on the one surface 201a of the core layer 201, so as to cover the interconnect layer 210. A material used for the insulating layer 211 and a thickness of the insulating layer 211 may be the same as those of the insulating layer 111, for example. The insulating layer 211 may include a filler, such as silica ($SiO_2$) or the like.

The interconnect layer 212 is formed on one surface of the insulating layer 211. The interconnect layer 212 includes via interconnects filling via holes 211x that penetrate the insulating layer 211 and expose the upper surface of the interconnect layer 210, and interconnect patterns formed on the upper surface of the insulating layer 211. The interconnect patterns of the interconnect layer 212 are electrically connected to the interconnect layer 210 through the via interconnects. Each via hole 211x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 210, for example. A material used for the interconnect layer 212 may be the same as the material used for the interconnect layer 110, for example.

The insulating layer 213 is formed on the upper surface of the insulating layer 211, so as to cover the interconnect layer 212. A material used for the insulating layer 213 and a thickness of the insulating layer 213 may be the same as those of the insulating layer 111, for example. The insulating layer 213 may include a filler, such as silica ($SiO_2$) or the like.

The interconnect layer 214 is formed on one surface of the insulating layer 213. The interconnect layer 214 includes via interconnects filling via holes 213x that penetrate the insulating layer 213 and expose the upper surface of the interconnect layer 212, and interconnect patterns formed on the upper surface of the insulating layer 213. The interconnect patterns of the interconnect layer 214 are electrically connected to the interconnect layer 212 through the via interconnects. Each via hole 213x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 212, for example. A material used for the interconnect layer 214 may be the same as the material used for the interconnect layer 110, for example.

The interconnect layer 220 is formed on the other surface 201b of the core layer 201. A material used for the interconnect layer 220 may be the same as the material used for the interconnect layer 110, for example.

The insulating layer 221 is formed on the other surface 201b of the core layer 201, so as to cover the interconnect layer 220. A material used for the insulating layer 221 and a thickness of the insulating layer 221 may be the same as those of the insulating layer 111, for example. The insulating layer 221 may include a filler, such as silica ($SiO_2$) or the like.

The interconnect layer 222 is formed on the other surface of the insulating layer 221. The interconnect layer 222 includes via interconnects filling via holes 221x that penetrate the insulating layer 221 and expose the lower surface of the interconnect layer 220, and interconnect patterns formed on the lower surface of the insulating layer 221. The interconnect patterns of the interconnect layer 222 are electrically connected to the interconnect layer 220 through the via interconnects. Each via hole 221x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 220, for example. A material used for the interconnect layer 222 may be the same as the material used for the interconnect layer 110, for example.

The insulating layer 223 is formed on the lower surface of the insulating layer 221, so as to cover the interconnect layer 222. A material used for the insulating layer 223 and a thickness of the insulating layer 223 may be the same as those of the insulating layer 111, for example. The insulating layer 223 may include a filler, such as silica ($SiO_2$) or the like.

The interconnect layer 224 is formed on the other surface of the insulating layer 223. The interconnect layer 224 includes via interconnects filling via holes 223x that penetrate the insulating layer 223 and expose the lower surface of the interconnect layer 222, and interconnect patterns formed on the lower surface of the insulating layer 223. The interconnect patterns of the interconnect layer 224 are electrically connected to the interconnect layer 222 through the via interconnects. Each via hole 223x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 222, for example. A material used for the interconnect layer 224 may be the same as the material used for the interconnect layer 110, for example.

As illustrated in FIG. 4A, the wiring board 300 includes an interconnect layer 310, an insulating layer 311, and an interconnect layer 312 that are successively laminated on one surface 301a of a core layer 301. The wiring board 300 also includes an interconnect layer 320, an insulating layer 321, and an interconnect layer 322 that are successively laminated on the other surface 301b of the core layer 301.

A material used for the core layer 301 may be the same as the material used for the core layer 101, for example.

The interconnect layer 310 is formed on the one surface 301a of the core layer 301. The interconnect layer 310 is electrically connected to the interconnect layer 320 through via interconnects 302 penetrating the core layer 301. A material used for the interconnect layer 310 may be the same as the material used for the interconnect layer 110, for example. The via interconnects 302 may be formed so as to cover an inner wall surface of via holes penetrating the core layer 301, and the insulating layer 303 may be provided inside the via interconnects 302.

The insulating layer 311 is formed on the one surface 301a of the core layer 301, so as to cover the interconnect layer 310. A material used for the insulating layer 311 and a thickness of the insulating layer 311 may be the same as those of the insulating layer 111, for example. The insulating layer 311 may include a filler, such as silica ($SiO_2$) or the like.

The interconnect layer 312 is formed on one surface of the insulating layer 311. The interconnect layer 312 includes via interconnects filling via holes 311x that penetrate the insulating layer 311 and expose the upper surface of the interconnect layer 310, and interconnect patterns formed on the upper surface of the insulating layer 311. The interconnect patterns of the interconnect layer 312 are electrically connected to the interconnect layer 310 through the via interconnects. Each via hole 311x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 310, for example. A material used for the interconnect layer 312 may be the same as the material used for the interconnect layer 110, for example.

The interconnect layer 320 is formed on the other surface 301b of the core layer 301. A material used for the interconnect layer 320 may be the same as the material used for the interconnect layer 110, for example.

The insulating layer 321 is formed on the other surface 301b of the core layer 301, so as to cover the interconnect layer 320. A material used for the insulating layer 321 and a thickness of the insulating layer 321 may be the same as those of the insulating layer 111, for example. The insulating layer 321 may include a filler, such as silica ($SiO_2$) or the like.

The interconnect layer 322 is formed on the other side of the insulating layer 321. The interconnect layer 322 includes via interconnects filling via holes 321x that penetrate the insulating layer 321 and expose the lower surface of the interconnect layer 320, and interconnect patterns formed on the lower surface of the insulating layer 321. The interconnect patterns of the interconnect layer 322 are electrically connected to the interconnect layer 320 through the via interconnects. Each via hole 321x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 320, for example. A material used for the interconnect layer 322 may be the same as the material used for the interconnect layer 110, for example.

As illustrated in FIG. 4B, the wiring board 400 includes an interconnect layer 410, an insulating layer 411, an interconnect layer 412, an insulating layer 413, and an interconnect layer 414 that are successively laminated on the one surface 401a of a core layer 401. The wiring board 400 also includes an interconnect layer 420, an insulating layer 421, an interconnect layer 422, an insulating layer 423, and an interconnect layer 424 that are successively laminated on the other surface 401b of the core layer 401.

A material used for the core layer 401 may be the same as the material used for the core layer 101, for example. The core layer 401 may not include the glass cloth or the like.

The interconnect layer 410 is formed on the one surface 401a of the core layer 401. The interconnect layer 410 is electrically connected to the interconnect layer 420 through via interconnects 402 penetrating the core layer 401. A material used for the interconnect layer 410 may be the same as the material used for the interconnect layer 110, for example.

The insulating layer 411 is formed on the one surface 401a of the core layer 401, so as to cover the interconnect layer 410. A material used for the insulating layer 411 and a thickness of the insulating layer 411 may be the same as those of the insulating layer 111, for example. The insulating layer 411 may include a filler, such as silica ($SiO_2$) or the like.

The interconnect layer 412 is formed on one surface of the insulating layer 411. The interconnect layer 412 includes via interconnects filling via holes 411x that penetrate the insulating layer 411 and expose the upper surface of the interconnect layer 410, and interconnect patterns formed on the upper surface of the insulating layer 411. The interconnect patterns of the interconnect layer 412 are electrically connected to the interconnect layer 410 through the via interconnects. Each via hole 411x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 410, for example. A material used for the interconnect layer 412 may be the same as the material used for the interconnect layer 110, for example.

The insulating layer 413 is formed on the upper surface of the insulating layer 411, so as to cover the interconnect layer 412. A material used for the insulating layer 413 and a thickness of the insulating layer 413 may be the same as those of the insulating layer 111, for example. The insulating layer 413 may include a filler, such as silica ($SiO_2$) or the like.

The interconnect layer 414 is formed on one surface of the insulating layer 413. The interconnect layer 414 includes via interconnects filling via holes 413x that penetrate the insulating layer 413 and expose the upper surface of the interconnect layer 412, and interconnect patterns formed on the upper surface of the insulating layer 413. The interconnect patterns of the interconnect layer 414 are electrically connected to the interconnect layer 412 through the via interconnects. Each via hole 413x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 412, for example. A material used for the interconnect layer 414 may be the same as the material used for the interconnect layer 110, for example.

The interconnect layer 420 is formed on the other surface 401b of the core layer 401. A material used for the interconnect layer 420 may be the same as the material used for the interconnect layer 110, for example.

The insulating layer 421 is formed on the other surface 401b of the core layer 401, so as to cover the interconnect layer 420. A material used for the insulating layer 421 and a thickness of the insulating layer 421 may be the same as those of the insulating layer 111, for example. The insulating layer 421 may include a filler, such as silica ($SiO_2$) or the like.

The interconnect layer 422 is formed on the other surface of the insulating layer 421. The interconnect layer 422 includes via interconnects filling via holes 421x that penetrate the insulating layer 421 and expose the lower surface of the interconnect layer 420, and interconnect patterns formed on the lower surface of the insulating layer 421. The interconnect patterns of the interconnect layer 422 are electrically connected to the interconnect layer 420 through the via interconnects. Each via hole 421x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 420, for example. A material used for the interconnect layer 422 may be the same as the material used for the interconnect layer 110, for example.

The insulating layer 423 is formed on the lower surface of the insulating layer 421, so as to cover the interconnect layer 422. A material used for the insulating layer 423 and a thickness of the insulating layer 423 may be the same as those of the insulating layer 111, for example. The insulating layer 423 may include a filler, such as silica ($SiO_2$) or the like.

The interconnect layer 424 is formed on the other surface of the insulating layer 423. The interconnect layer 424 includes via interconnects filling via holes 423x that penetrate the insulating layer 423 and expose the lower surface of the interconnect layer 422, and interconnect patterns formed on the lower surface of the insulating layer 423. The interconnect patterns of the interconnect layer 424 are electrically connected to the interconnect layer 422 through the via interconnects. Each via hole 423x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 422, for example. A material used for the interconnect layer 424 may be the same as the material used for the interconnect layer 110, for example.

As illustrated in FIG. 5A, the wiring board 500 includes an interconnect layer 510, an insulating layer 511, an interconnect layer 512, an insulating layer 513, and an interconnect layer 514 that are successively laminated on one surface 501a of a core layer 501. The wiring board 500 also includes an interconnect layer 520, an insulating layer 521, an interconnect layer 522, an insulating layer 523, and an interconnect layer 524 that are successively laminated on the other surface 501b of the core layer 501.

A material used for the core layer 501 may be the same as the material used for the core layer 101, for example. The core layer 501 may not include the glass cloth or the like.

The interconnect layer 510 is formed on the one surface 501a of the core layer 501. The interconnect layer 510 is electrically connected to the interconnect layer 520 through via interconnects 502 penetrating the core layer 501. A material used for the interconnect layer 510 may be the same as the material used for the interconnect layer 110, for example.

The insulating layer 511 is formed on the one surface 501a of the core layer 501, so as to cover the interconnect layer 510. A material used for the insulating layer 511 and a thickness of the insulating layer 511 may be the same as those of the insulating layer 111, for example. The insulating layer 511 may include a filler, such as silica ($SiO_2$) or the like.

The interconnect layer 512 is formed on one surface of the insulating layer 511. The interconnect layer 512 includes via interconnects filling via holes 511x that penetrate the insulating layer 511 and expose the upper surface of the interconnect layer 510, and interconnect patterns formed on the upper surface of the insulating layer 511. The interconnect patterns of the interconnect layer 512 are electrically connected to the interconnect layer 510 through the via interconnects. Each via hole 511x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 510, for example. A material used for the interconnect layer 512 may be the same as the material used for the interconnect layer 110, for example.

The insulating layer 513 is formed on the upper surface of the insulating layer 511, so as to cover the interconnect layer 512. A material used for the insulating layer 513 and a thickness of the insulating layer 513 may be the same as those of the insulating layer 111, for example. The insulating layer 513 may include a filler, such as silica ($SiO_2$) or the like.

The interconnect layer 514 is formed on one surface of the insulating layer 513. The interconnect layer 514 includes via interconnects filling via holes 513x that penetrate the insulating layer 513 and expose the upper surface of the interconnect layer 512, and interconnect patterns formed on the upper surface of the insulating layer 513. The interconnect patterns of the interconnect layer 514 are electrically connected to the interconnect layer 512 through the via interconnects. Each via hole 513x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 512, for example. A material used for the interconnect layer 514 may be the same as the material used for the interconnect layer 110, for example.

The interconnect layer 520 is formed on the other surface 501b of the core layer 501. A material used for the interconnect layer 520 may be the same as the material used for the interconnect layer 110, for example.

The insulating layer 521 is formed on the other surface 501b of the core layer 501, so as to cover the interconnect layer 520. A material used for the insulating layer 521 and a thickness of the insulating layer 521 may be the same as those of the insulating layer 111, for example. The insulating layer 521 may include a filler, such as silica ($SiO_2$) or the like.

The interconnect layer 522 is formed on the other surface of the insulating layer 521. The interconnect layer 522 includes via interconnects filling via holes 521x that penetrate the insulating layer 521 and expose the lower surface of the interconnect layer 520, and interconnect patterns formed on the lower surface of the insulating layer 521. The interconnect patterns of the interconnect layer 522 are electrically connected to the interconnect layer 520 through the via interconnects. Each via hole 521x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 520, for example. A material used for the interconnect layer 522 may be the same as the material used for the interconnect layer 110, for example.

The insulating layer 523 is formed on the lower surface of the insulating layer 521, so as to cover the interconnect layer 522. A material used for the insulating layer 523 and a thickness of the insulating layer 523 may be the same as those of the insulating layer 111, for example. The insulating layer 523 may include a filler, such as silica ($SiO_2$) or the like.

The interconnect layer 524 is formed on the other side of the insulating layer 523. The interconnect layer 524 includes via interconnects filling via holes 523x that penetrate the insulating layer 523 and expose the lower surface of the interconnect layer 522, and interconnect patterns formed on the lower surface of the insulating layer 523. The interconnect patterns of the interconnect layer 524 are electrically connected to the interconnect layer 522 through the via interconnects. Each via hole 523x may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 522, for example. A material used for the interconnect layer 524 may be the same as the material used for the interconnect layer 110, for example.

As illustrated in FIG. 5B, the wiring board 600 includes an interconnect layer 610, an insulating layer 611, an interconnect layer 612, an insulating layer 613, an interconnect layer 614, and a solder resist layer 615 that are successively laminated on one surface 601a of a core layer 601. The wiring board 600 also includes an interconnect layer 620, an insulating layer 621, an interconnect layer 622, an insulating layer 623, and an interconnect layer 624 that are successively laminated on the other surface 601b of the core layer 601.

A material used for the core layer 601 may be the same as the material used for the core layer 101, for example. The core layer 601 may not include the glass cloth or the like.

The interconnect layer 610 is formed on the one surface 601a of the core layer 601. The interconnect layer 610 is electrically connected to the interconnect layer 620 through via interconnects 602 penetrating the core layer 601. A material used for the interconnect layer 610 may be the same as the material used for the interconnect layer 110, for example.

The insulating layer 611 is formed on the one surface 601a of the core layer 601, so as to cover the interconnect layer 610. A material used for the insulating layer 611 and a thickness of the insulating layer 611 may be the same as those of the insulating layer 111, for example. The insulating layer 611 may include a filler, such as silica ($SiO_2$) or the like.

The interconnect layer 612 is formed on one surface of the insulating layer 611. The interconnect layer 612 includes via interconnects filling via holes 611x that penetrate the insulating layer 611 and expose the upper surface of the interconnect layer 610, and interconnect patterns formed on the upper surface of the insulating layer 611. The interconnect patterns of the interconnect layer 612 are electrically connected to the interconnect layer 610 through the via interconnects. Each via hole 611x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 610, for example. A material used for the interconnect layer 612 may be the same as the material used for the interconnect layer 110, for example.

The insulating layer 613 is formed on the upper surface of the insulating layer 611, so as to cover the interconnect layer 612. A material used for the insulating layer 613 and a thickness of the insulating layer 613 may be the same as those of the insulating layer 111, for example. The insulating layer 613 may include a filler, such as silica ($SiO_2$) or the like.

The interconnect layer 614 is formed on one surface of the insulating layer 613. The interconnect layer 614 includes via interconnects filling via holes 613x that penetrate the insulating layer 613 and expose the upper surface of the interconnect layer 612, and interconnect patterns formed on the upper surface of the insulating layer 613. The interconnect patterns of the interconnect layer 614 are electrically connected to the interconnect layer 612 through the via interconnects. Each via hole 613x may be a cavity having an inverted truncated cone shape, and a diameter of an opening of the cavity at one end which opens upward is greater than a diameter of an opening of the cavity at the other end (that is, a bottom surface of the cavity) formed by the upper surface of the interconnect layer 612, for example. A material used for the interconnect layer 614 may be the same as the material used for the interconnect layer 110, for example.

The solder resist layer 615 is the outermost layer on the one surface of the wiring board 600, and is an insulating layer formed on the upper surface of the insulating layer 613 so as to cover the interconnect layer 614. A material used for the solder resist layer 615 and a thickness of the solder resist layer 615 may be the same as those of the solder resist layer 125, for example.

The solder resist layer 615 has openings 615x, and a part of the upper surface of the interconnect layer 614 is exposed at the bottom of the openings 615x. The planar shape of the openings 615x may be a circular shape, for example. A metallic layer may be formed on the upper surface of the interconnect layer 614 exposed inside the openings 615x, or the exposed part of the upper surface of the interconnect layer 614 may be subjected to an anti-oxidation treatment, such as the OSP treatment or the like, as required.

External connection terminals 616 are formed on the upper surface of the interconnect layer 614 exposed at the bottom of the openings 615x. The external connection terminals 616 may be solder bumps, for example. Examples of a material used for the solder bumps include alloys including Pb, alloys of Sn and Cu, alloys of Sn and Ag, alloys of Sn, Ag and Cu, or the like, for example. The external connection terminals 616 serve as terminals for making electrical connections to a semiconductor chip.

The interconnect layer 620 is formed on the other surface 601b of the core layer 601. A material used for the interconnect layer 620 may be the same as the material used for the interconnect layer 110, for example.

The insulating layer 621 is formed on the other surface 601b of the core layer 601, so as to cover the interconnect layer 620. A material used for the insulating layer 621 and a thickness of the insulating layer 621 may be the same as those of the insulating layer 111, for example. The insulating layer 621 may include a filler, such as silica ($SiO_2$) or the like.

The interconnect layer 622 is formed on the other surface of the insulating layer 621. The interconnect layer 622 includes via interconnects filling via holes 621x that penetrate the insulating layer 621 and expose the lower surface of the interconnect layer 620, and interconnect patterns formed on the lower surface of the insulating layer 621. The interconnect patterns of the interconnect layer 622 are electrically connected to the interconnect layer 620 through the via interconnects. Each via hole 621$x$ may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 620, for example. A material used for the interconnect layer 622 may be the same as the material used for the interconnect layer 110, for example.

The insulating layer 623 is formed on the lower surface of the insulating layer 621, so as to cover the interconnect layer 622. A material used for the insulating layer 623 and a thickness of the insulating layer 623 may be the same as those of the insulating layer 111, for example. The insulating layer 623 may include a filler, such as silica (SiO$_2$) or the like.

The interconnect layer 624 is formed on the other surface of the insulating layer 623. The interconnect layer 624 includes via interconnects filling via holes 623$x$ that penetrate the insulating layer 623 and expose the lower surface of the interconnect layer 622, and interconnect patterns formed on the lower surface of the insulating layer 623. The interconnect patterns of the interconnect layer 624 are electrically connected to the interconnect layer 622 through the via interconnects. Each via hole 623$x$ may be a cavity having a truncated cone shape, and a diameter of an opening of the cavity at one end which opens downward is greater than a diameter of an opening of the cavity at the other end (that is, a bottom surface of the cavity) formed by the lower surface of the interconnect layer 622, for example. A material used for the interconnect layer 624 may be the same as the material used for the interconnect layer 110, for example.

The conductive bonding materials 226 mechanically bond and electrically connect the interconnect patterns of the interconnect layer 114 of the wiring board 100 and the interconnect patterns of the interconnect layer 224 of the wiring board 200 to one another. The conductive bonding materials 326 mechanically bond and electrically connect the interconnect patterns of the interconnect layer 214 of the wiring board 200 and the interconnect patterns of the interconnect layer 322 of the wiring board 300 to one another. The conductive bonding materials 426 mechanically bond and electrically connect the interconnect patterns of the interconnect layer 312 of the wiring board 300 and the interconnect patterns of the interconnect layer 424 of the wiring board 400 to one another. The conductive bonding materials 526 mechanically bond and electrically connect the interconnect patterns of the interconnect layer 312 of the wiring board 300 and the interconnect patterns of the interconnect layer 524 of the wiring board 500 to one another. A part of the conductive bonding materials 626 mechanically bond and electrically connect the interconnect patterns of the interconnect layer 414 of the wiring board 400 and the interconnect patterns of the interconnect layer 624 of the wiring board 600 to one another. Another part of the conductive bonding materials 626 mechanically bond and electrically connect the interconnect patterns of the interconnect layer 514 of the wiring board 500 and the interconnect patterns of the interconnect layer 624 of the wiring board 600 to one another. The conductive bonding materials 426 and 526 are an example of a first conductive bonding material, the conductive bonding materials 626 are an example of a second conductive bonding material, and the conductive bonding materials 226 are an example of a third conductive bonding material.

The insulating resin layer 700 includes an adhesive portion 711, an adhesive portion 712, an adhesive portion 713, an adhesive portion 714, a side surface covering portion 720, and an adhesive portion 730. The adhesive portion 711 is provided between the upper surface of the wiring board 100 and the lower surface of the wiring board 200. The adhesive portion 711 adheres the wiring boards 100 and 200 to each other. The adhesive portion 712 is provided between the upper surface of the wiring board 200 and the lower surface of the wiring board 300. The adhesive portion 712 adheres the wiring boards 200 and 300 to each other. The adhesive portion 713 is provided between the upper surface of the wiring board 300 and each of the lower surfaces of the wiring boards 400 and 500. The adhesive portion 713 adheres the wiring boards 300 and 400 to each other, and adheres the wiring boards 300 and 500 to each other. The adhesive portion 714 is provided between each of the upper surfaces of the wiring boards 400 and 500 and the lower surface of the wiring board 600. The adhesive portion 714 adheres the wiring boards 400 and 600 to each other, and adheres the wiring boards 500 and 600 to each other. The adhesive portion 730 is provided between a side surface of the wiring board 400 and a side surface of the wiring board 500. The adhesive portion 730 adheres the wiring boards 400 and 500 to each other. The side surface covering portion 720 covers a side surface of the wiring board 200, a side surface of the wiring board 300, the side surface of the wiring board 400, the side surface of the wiring board 500, and a side surface of the wiring board 600. The side surface covering portion 720 further covers the upper surface of the wiring board 100 in an annular shape. For example, the adhesive portions 711, 712, 713, and 714, the side surface covering portion 720, and the adhesive portion 730 are integrated and unified. A material used for the insulating resin layer 700 may be an epoxy-based resin, for example. The adhesive portion 713 is an example of a first insulating resin layer, the adhesive portion 714 is an example of a second insulating resin layer, the side surface covering portion 720 is an example of a third insulating resin layer, and the adhesive portion 711 is an example of a fourth insulating resin layer. The adhesive portion 712 is an example of a fifth insulating resin layer.

<Method for Manufacturing Laminated Wiring Board>

Next, a method for manufacturing the laminated wiring board according to the first embodiment will be described. FIG. 6A through FIG. 17 are diagrams illustrating an example of the method for manufacturing the laminated wiring board according to the first embodiment. FIG. 6A, FIG. 7A, FIG. 8A, FIG. 9A, FIG. 10A, and FIG. 11A are perspective views. FIG. 6B, FIG. 7B, FIG. 8B, FIG. 9B, FIG. 10B, FIG. 11B, and FIG. 12A through FIG. 17 are cross sectional views.

First, as illustrated in FIG. 6A through FIG. 11B, large wiring boards 100$t$, 200$t$, 300$t$, 400$t$, 500$t$, and 600$t$ are manufactured.

Figure 6A:
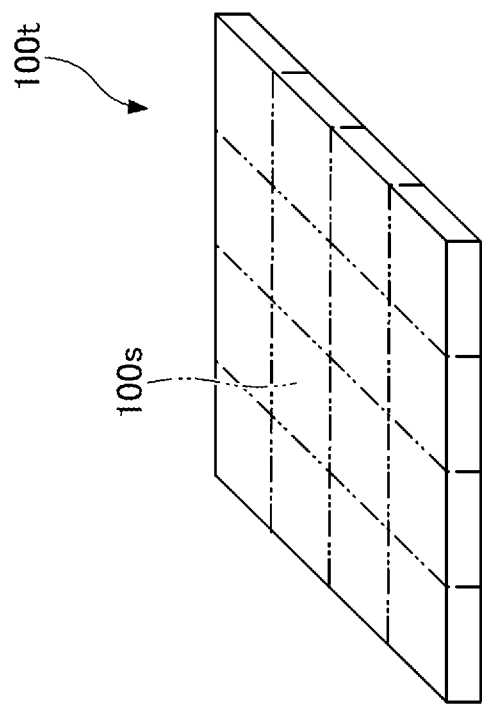
FIG. 6A and FIG. 6B are diagrams (part 1) illustrating an example of a method for manufacturing the laminated wiring board according to the first embodiment.
Figure 6B:
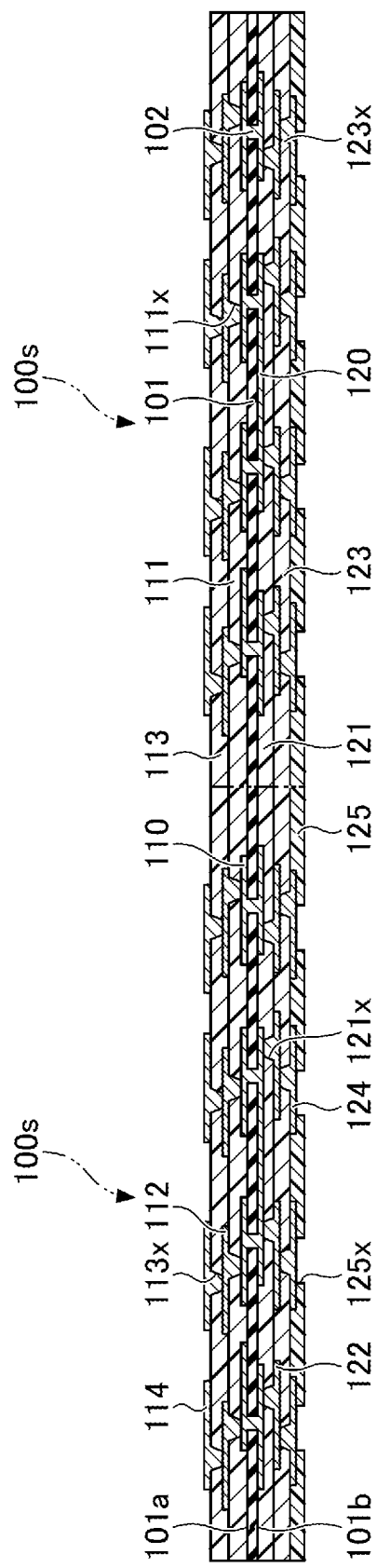

FIG. 6A is a perspective view of the large wiring board 100$t$, and FIG. 6B is a cross sectional view of the large wiring board 100$t$. The large wiring board 100$t$ includes a plurality of wiring board regions 100$s$ that becomes the wiring board 100 after singulation. FIG. 6B illustrates two wiring board regions 100$s$. In the following description, the same names and reference numerals as those of the portions that are finally formed on the wiring board 100 are used to describe the portions in the large wiring board 100$t$.

When manufacturing the large wiring board 100$t$, the via interconnects 102, the interconnect layer 110, and the interconnect layer 120 are first formed in the core layer 101.

More particularly, the via holes are formed in the core layer 101 by a laser beam machining using a CO2 laser or the like, for example, and the via interconnects 102 are formed inside the via holes. In addition, the interconnect layer 110 is formed on the one surface 101a of the core layer 101, and the interconnect layer 120 is formed on the other surface 101b of the core layer 101, by the subtractive method or the like.

Next, the insulating layer 111 is formed by laminating a semi-cured film of an epoxy-based resin or the like on the one surface 101a of the core layer 101, so as to cover the interconnect layer 110, and curing the film. The insulating layer 121 is formed by laminating a semi-cured film of an epoxy-resin or the like on the other surface 101b of the core layer 101, so as to cover the interconnect layer 120, and curing the film. Alternatively, instead of laminating the film of the epoxy-based resin or the like, a liquid or paste of the epoxy-based resin or the like may be coated and thereafter cured, to form the insulating layers 111 and 121.

Next, the via holes 111x that penetrate the insulating layer 111 and expose the upper surface of the interconnect layer 110 are formed in the insulating layer 111. In addition, the via holes 121x that penetrate the insulating layer 121 and expose the lower surface of the interconnect layer 120 are formed in the insulating layer 121. The via holes 111x and 121x can be formed by the laser beam machining using the CO2 laser or the like, for example. After forming the via holes 111x and 121x, it is preferable to perform a desmear process to remove resin residue adhered to the surfaces of the interconnect layers 110 and 120 exposed at the bottoms of the via holes 111x and 121x, respectively.

Next, the interconnect layer 112 is formed on the one surface of the insulating layer 111. The interconnect layer 112 includes the via interconnects filling the via holes 111x, and the interconnect patterns formed on the upper surface of the insulating layer 111. Further, the interconnect layer 122 is formed on the other surface of the insulating layer 121. The interconnect layer 122 includes the via interconnects filling the via holes 121x, and the interconnect patterns formed on the lower surface of the insulating layer 121. The interconnect layers 112 and 122 can be formed using various interconnect forming methods, such as the semi-additive method, the subtractive method, or the like.

For example, when the interconnect layer 112 is formed by the semi-additive method, a seed layer is formed by electroless plating of copper on the surface of the insulating layer 111 including the inner wall of the via holes 111x and on the surface of the interconnect layer 110 exposed inside the via holes 111x. Then, a plating resist pattern having openings corresponding to the shape of the interconnect patterns of the interconnect layer 112 are formed on the seed layer. Next, an electrolytic plating layer is deposited on the seed layer exposed inside the openings of the plating resist pattern by electrolytic plating of copper, using the seed layer as a power feeding layer. Then, the plating resist pattern is removed. Next, etching is performed using the electrolytic plating layer as a mask, to remove the seed layer exposed from the electrolytic plating layer. The interconnect layer 112 can be formed in this manner. The interconnect layer 122 can also be formed by the semi-additive method, similar to the interconnect layer 110.

After forming the interconnect layers 112 and 122, the insulating layer 113 is formed on the upper surface of the insulating layer 111 by a method similar to that used to form the insulating layer 111, so as to cover the interconnect layer 112. Next, the via holes 113x are formed by a method similar to that used to form the via holes 111x. Next, the interconnect layer 114 is formed on one surface of the insulating layer 113 by a method similar to that used to form the interconnect layer 112. In addition, the insulating layer 123 is formed on the lower surface of the insulating layer 121 by a method similar to that used to form the insulating layer 111, so as to cover the interconnect layer 122. Next, the via holes 123x are formed by a method similar to that used to form the via holes 111x. Next, the interconnect layer 124 is formed on the other surface of the insulating layer 123 by a method similar to that used to form the interconnect layer 112.

Next, the solder resist layer 125 is formed on the lower surface of the insulating layer 123, so as to cover the interconnect layer 124. The solder resist layer 125 can be formed by coating a liquid or a paste of a photosensitive epoxy-based resin or an acrylic-based resin on the lower surface of the insulating layer 123 by screen printing, roll coating, spin coating, or the like, for example, so as to cover the interconnect layer 124. Alternatively, a film of the photosensitive epoxy-based resin or the acrylic-based resin may be laminated on the lower surface of the insulating layer 123, for example, so as to cover the interconnect layer 124.

Next, by exposing and developing the solder resist layer 125, the openings 125x that expose a part of the lower surface of the interconnect layer 124 are formed in the solder resist layer 125 by photolithography, for example. The openings 125x may also be formed by the laser beam machining or a blasting. In this case, the photosensitive material does not need to be used for the solder resist layer 125.

The large wiring board 100t can be manufactured in the manner described above.

Figure 7A:
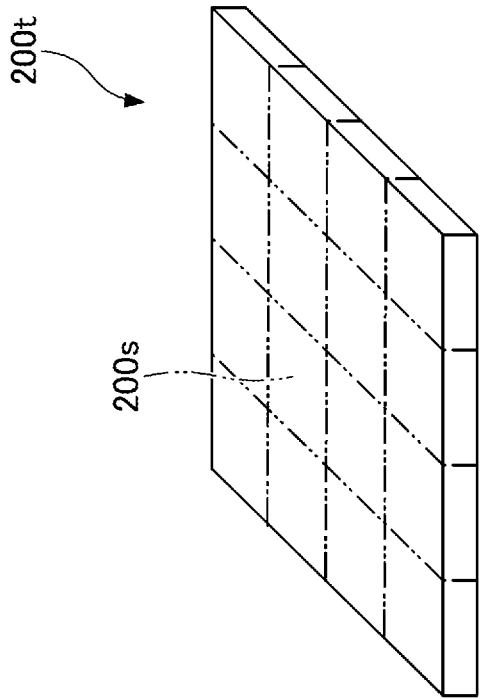
FIG. 7A and FIG. 7B are diagrams (part 2) illustrating the example of the method for manufacturing the laminated wiring board according to the first embodiment.
Figure 7B:
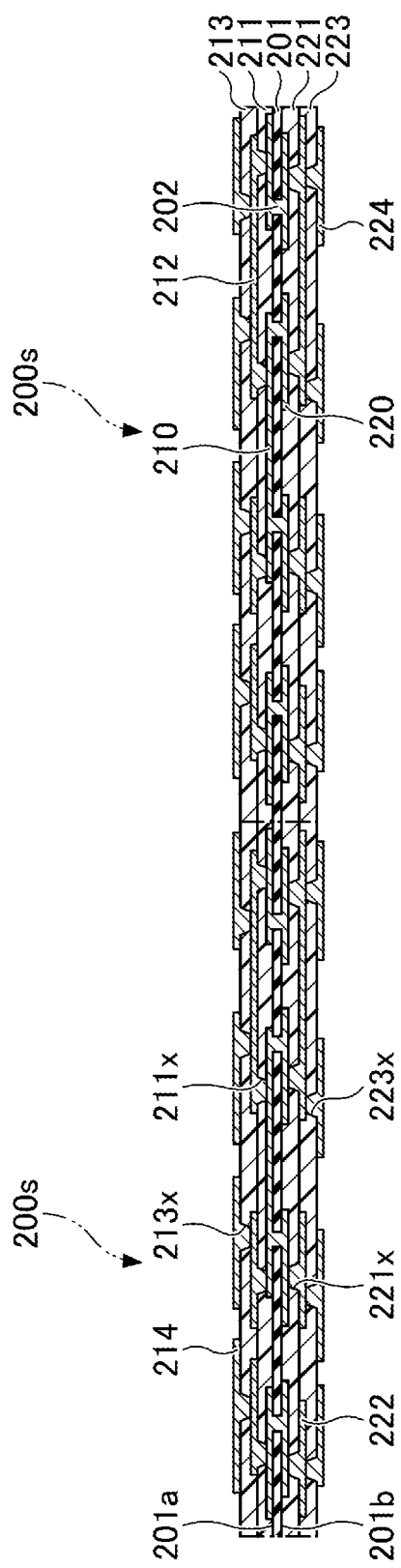

FIG. 7A is a perspective view of the large wiring board 200t, and FIG. 7B is a cross sectional view of the large wiring board 200t. The large wiring board 200t includes a plurality of wiring board regions 200s that becomes the wiring board 200 after singulation. FIG. 7B illustrates two wiring board regions 200s. In the following description, the same names and reference numerals as those of the portions that are finally formed on the wiring board 200 are used to describe the portions in the large wiring board 200t.

When manufacturing the large wiring board 200t, the via interconnects 202, the interconnect layer 210, and the interconnect layer 220 are first formed in the core layer 201. The via interconnects 202 can be formed by a method similar to that used to form the via interconnects 102, for example. The interconnect layers 210 and 220 can be formed by a method similar to that used to form the interconnect layer 110, for example.

Next, the insulating layer 211 is formed on the one surface 201a of the core layer 201, so as to cover the interconnect layer 210, and the insulating layer 221 is formed on the other surface 201b of the core layer 201, so as to cover the interconnect layer 220. The insulating layers 211 and 221 can be formed by a method similar to that used to form the insulating layer 111, for example. Further, the via holes 211x are formed in the insulating layer 211, and the via holes 221x are formed in the insulating layer 221. The via holes 211x and 221x can be formed by a method similar to that used to form the via holes 111x, for example.

Next, the interconnect layer 212 is formed on the one surface of the insulating layer 211, and the interconnect layer 222 is formed on the other surface of the insulating layer 221. The interconnect layers 212 and 222 can be formed by a method similar to that used to form the interconnect layer 112, for example.

Next, the insulating layer 213 is formed on the upper surface of the insulating layer 211, so as to cover the interconnect layer 212, and the insulating layer 223 is formed on the lower surface of the insulating layer 221, so as to cover the interconnect layer 222. The insulating layers 213 and 223 can be formed by a method similar to that used to form the insulating layer 111, for example. Further, the via holes 213x are formed in the insulating layer 213, and the via holes 223x are formed in the insulating layer 223. The via holes 213x and 223x can be formed by a method similar to that used to form the via holes 111x, for example.

Next, the interconnect layer 214 is formed on the one surface of the insulating layer 213, and the interconnect layer 224 is formed on the other surface of the insulating layer 223. The interconnect layers 214 and 224 can be formed by a method similar to that used to form the interconnect layer 112, for example.

The large wiring board 200t can be manufactured in the manner described above.

FIG. 8A is a perspective view of the large wiring board 300t, and FIG. 8B is a cross sectional view of the large wiring board 300t. The large wiring board 300t includes a plurality of wiring board regions 300s that becomes the wiring board 300 after singulation. FIG. 8B illustrates two wiring board regions 300s. In the following description, the same names and reference numerals as those of the portions that are finally foiled on the wiring board 300 are used to describe the portions in the large wiring board 300t.

When manufacturing the large wiring board 300t, the via interconnects 302, the insulating layer 303, the interconnect layer 310, and the interconnect layer 320 are first formed in the core layer 301. The via interconnects 302 can be formed by a method similar to that used to form the via interconnects 102, for example. The interconnect layers 310 and 320 can be formed by a method similar to that used to form the interconnect layer 110, for example. For example, the insulating layer 303 is formed so as to fill an inside of the via interconnects 302 in the via holes, after the via interconnects 302 are formed.

Next, the insulating layer 311 is formed on the one surface 301a of the core layer 301, so as to cover the interconnect layer 310, and the insulating layer 321 is formed on the other surface 301b of the core layer 301, so as to cover the interconnect layer 320. The insulating layers 311 and 321 can be formed by a method similar to that used to form the insulating layer 111, for example. Further, the via holes 311x are formed in the insulating layer 311, and the via holes 321x are formed in the insulating layer 321. The via holes 311x and 321x can be formed by a method similar to that used to form the via holes 111x, for example.

Next, the interconnect layer 312 is formed on the one surface of the insulating layer 311, and the interconnect layer 322 is formed on the other surface of the insulating layer 321. The interconnect layers 312 and 322 can be formed by a method similar to that used to form the interconnect layer 112, for example.

The large wiring board 300t can be manufactured in the manner described above.

Figure 9A:
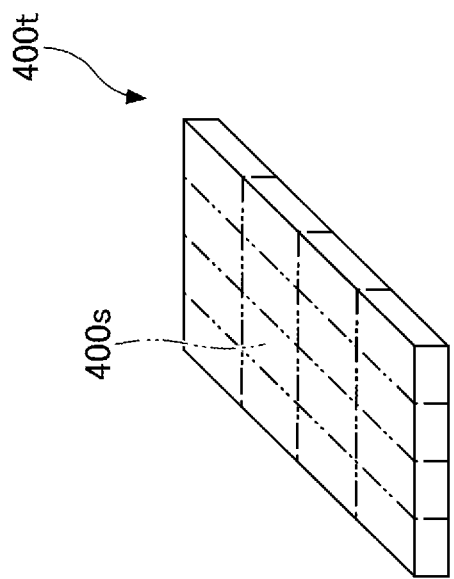
FIG. 9A and FIG. 9B are diagrams (part 4) illustrating the example of the method for manufacturing the laminated wiring board according to the first embodiment.
Figure 9B:
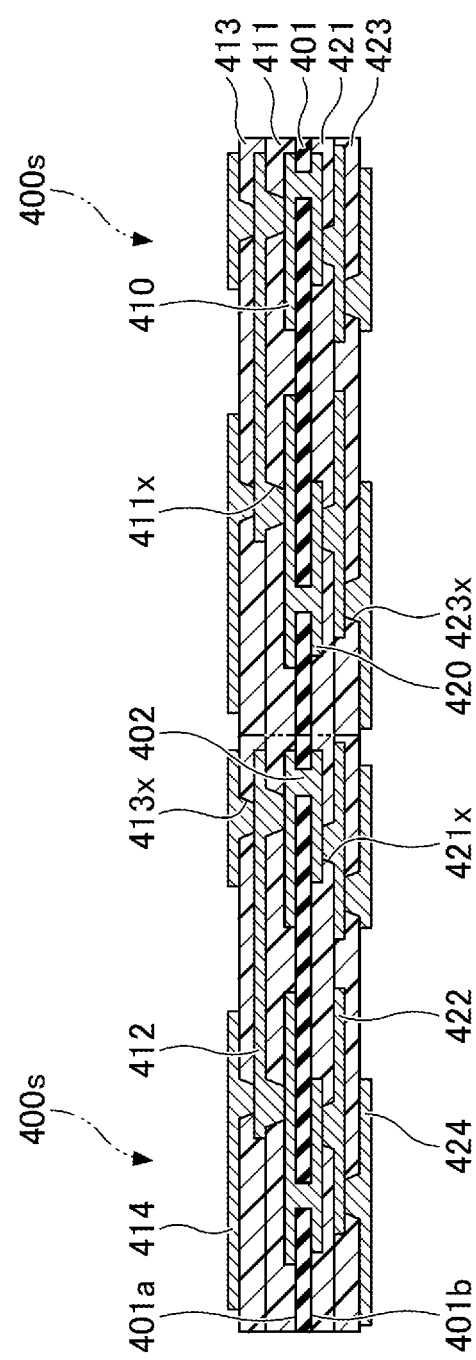

FIG. 9A is a perspective view of the large wiring board 400t, and FIG. 9B is a cross sectional view of the large wiring board 400t. The large wiring board 400t includes a plurality of wiring board regions 400s that becomes the wiring board 400 after singulation. FIG. 9B illustrates two wiring board regions 400s. In the following description, the same names and reference numerals as those of the portions that are finally formed on the wiring board 400 are used to describe the portions in the large wiring board 400t.

When manufacturing the large wiring board 400t, the via interconnects 402, the interconnect layer 410, and the interconnect layer 420 are first formed in the core layer 401. The via interconnects 402 can be formed by a method similar to that used to form the via interconnects 102, for example. The interconnect layers 410 and 420 can be formed by a method similar to that used to form the interconnect layer 110, for example.

Next, the insulating layer 411 is formed on the one surface 401a of the core layer 401, so as to cover the interconnect layer 410, and the insulating layer 421 is formed on the other surface 401b of the core layer 401, so as to cover the interconnect layer 420. The insulating layers 411 and 421 can be formed by a method similar to that used to form the insulating layer 111, for example. Further, the via holes 411x are formed in the insulating layer 411, and the via holes 421x are formed in the insulating layer 421. The via holes 411x and 421x can be formed by a method similar to that used to form the via holes 111x, for example.

Next, the interconnect layer 412 is formed on the one surface of the insulating layer 411, and the interconnect layer 422 is formed on the other surface of the insulating layer 421. The interconnect layers 412 and 422 can be formed by a method similar to that used to form the interconnect layer 112, for example.

Next, the insulating layer 413 is formed on the upper surface of the insulating layer 411, so as to cover the interconnect layer 412, and the insulating layer 423 is formed on the lower surface of the insulating layer 421, so as to cover the interconnect layer 422. The insulating layers 413 and 423 can be formed by a method similar to that used to form the insulating layer 111, for example. Further, the via holes 413x are formed in the insulating layer 413, and the via holes 423x are formed in the insulating layer 423. The via holes 413x and 423x can be formed by a method similar to that used to form the via holes 111x, for example.

Next, the interconnect layer 414 is formed on the one surface of the insulating layer 413, and the interconnect layer 424 is formed on the other surface of the insulating layer 423. The interconnect layers 414 and 424 can be formed by a method similar to that used to form the interconnect layer 112, for example.

The large wiring board 400t can be manufactured in the manner described above.

Figure 10A:
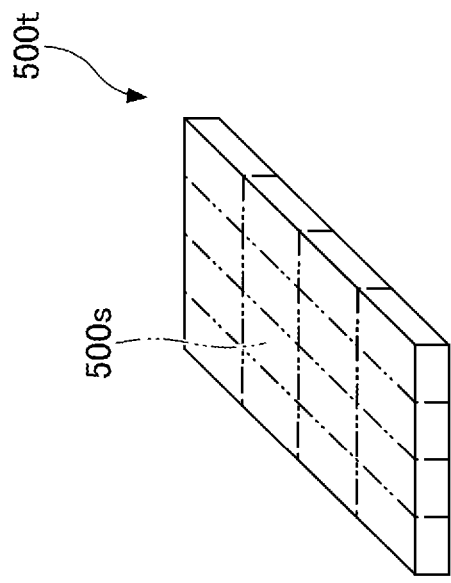
FIG. 10A and FIG. 10B are diagrams (part 5) illustrating the example of the method for manufacturing the laminated wiring board according to the first embodiment.
Figure 10B:
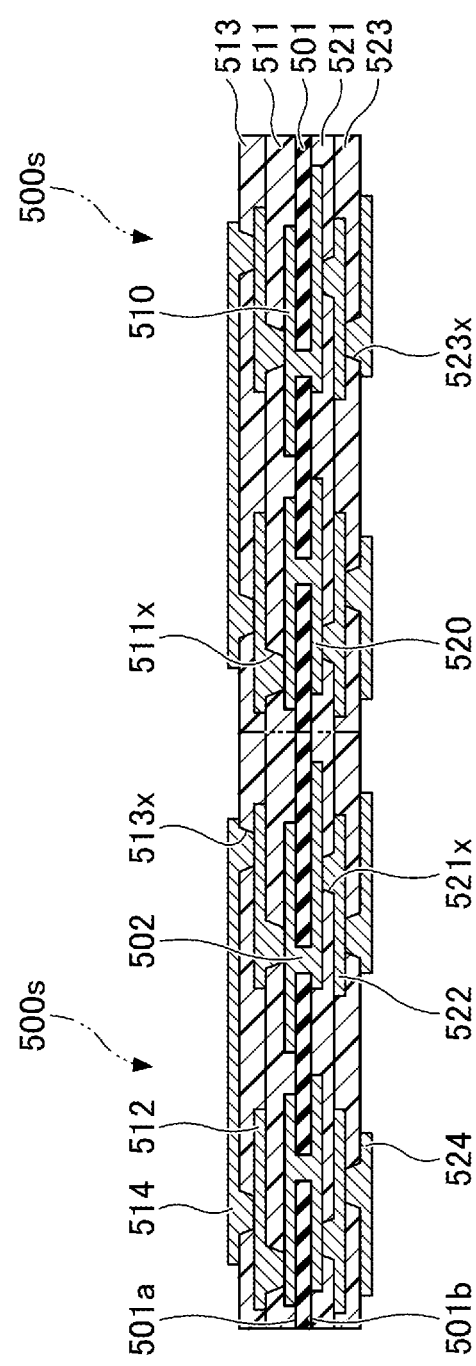

FIG. 10A is a perspective view of the large wiring board 500t, and FIG. 10B is a cross sectional view of the large wiring board 500t. The large wiring board 500t includes a plurality of wiring board regions 500s that becomes the wiring board 500 after singulation. FIG. 10B illustrates two wiring board regions 500s. In the following description, the same names and reference numerals as those of the portions that are finally formed on the wiring board 500 are used to describe the portions in the large wiring board 500t.

When manufacturing the large wiring board 500t, the via interconnects 502, the interconnect layer 510, and the interconnect layer 520 are first formed in the core layer 501. The via interconnects 502 can be formed by a method similar to that used to form the via interconnects 102, for example. The interconnect layers 510 and 520 can be formed by a method similar to that used to form the interconnect layer 110, for example.

Next, the insulating layer 511 is formed on the one surface 501a of the core layer 501, so as to cover the interconnect layer 510, and the insulating layer 521 is formed on the other surface 501b of the core layer 501, so as to cover the interconnect layer 520. The insulating layers 511 and 521 can be formed by a method similar to that used to form the insulating layer 111, for example. Further, the via holes 511x are formed in the insulating layer 511, and the via holes 521x are formed in the insulating layer 521. The via holes 511x and 521x can be formed by a method similar to that used to form the via holes 111x, for example.

Next, the interconnect layer 512 is formed on the one surface of the insulating layer 511, and the interconnect layer 522 is formed on the other surface of the insulating layer 521. The interconnect layers 512 and 522 can be formed by a method similar to that used to form the interconnect layer 112, for example.

Next, the insulating layer 513 is formed on the upper surface of the insulating layer 511, so as to cover the interconnect layer 512, and the insulating layer 523 is formed on the lower surface of the insulating layer 521, so as to cover the interconnect layer 522. The insulating layers 513 and 523 can be formed by a method similar to that used to form the insulating layer 111, for example. Further, the via holes 513x are formed in the insulating layer 513, and the via holes 523x are formed in the insulating layer 523. The via holes 513x and 523x can be formed by a method similar to that used to form the via holes 111x, for example.

Next, the interconnect layer 514 is formed on the one surface of the insulating layer 513, and the interconnect layer 524 is formed on the other surface of the insulating layer 523. The interconnect layers 514 and 524 can be formed by a method similar to that used to form the interconnect layer 112, for example.

The large wiring board 500t can be manufactured in the manner described above.

Figure 11A:
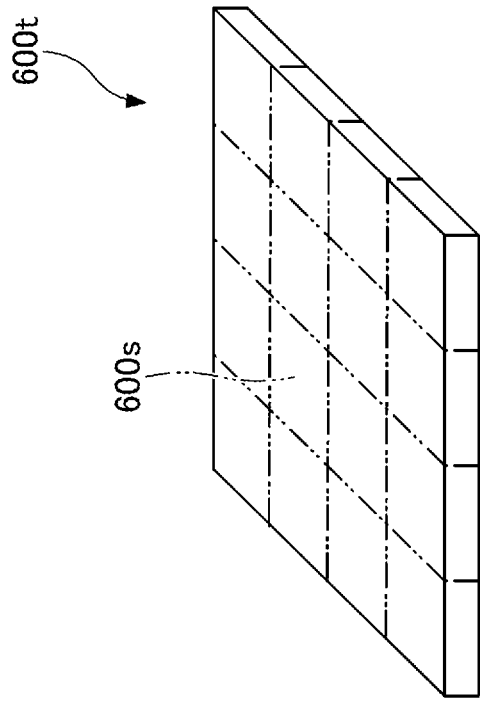
FIG. 11A and FIG. 11B are diagrams (part 6) illustrating the example of the method for manufacturing the laminated wiring board according to the first embodiment.
Figure 11B:
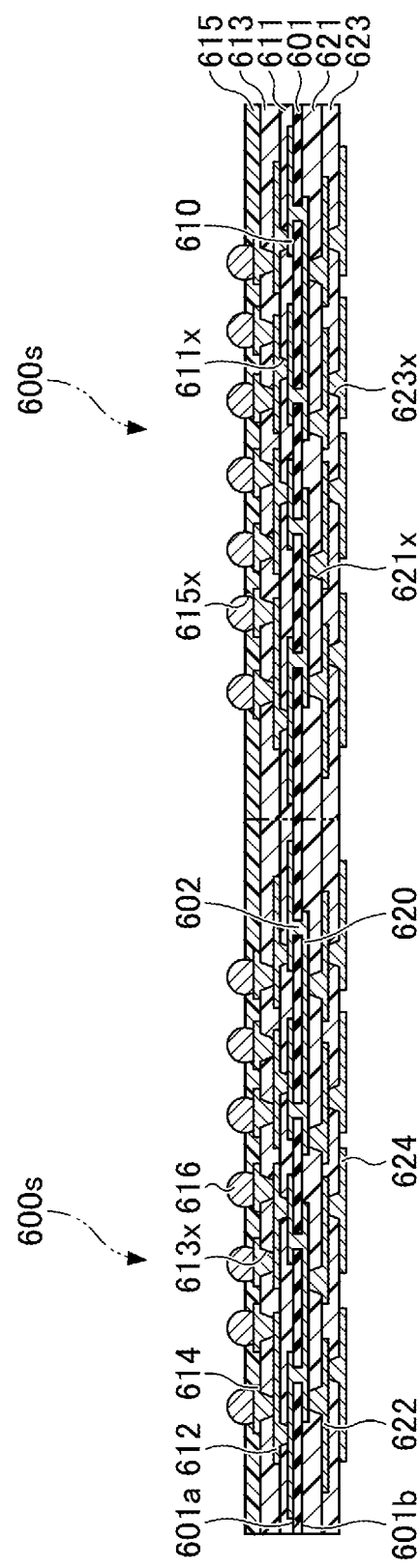

FIG. 11A is a perspective view of the large wiring board 600t, and FIG. 11B is a cross sectional view of the large wiring board 600t. The large wiring board 600t includes a plurality of wiring board regions 600s that becomes the wiring board 600 after singulation. FIG. 11B illustrates two wiring board regions 600s. In the following description, the same names and reference numerals as those of the portions that are finally formed on the wiring board 600 are used to describe the portions in the large wiring board 600t.

When manufacturing the large wiring board 600t, the via interconnects 602, the interconnect layer 610, and the interconnect layer 620 are first formed in the core layer 601. The via interconnects 602 can be formed by a method similar to that used to form the via interconnects 102, for example. The interconnect layers 610 and 620 can be formed by a method similar to that used to form the interconnect layer 110, for example.

Next, the insulating layer 611 is formed on the one surface 601a of the core layer 601, so as to cover the interconnect layer 610, and the insulating layer 621 is formed on the other surface 601b of the core layer 601, so as to cover the interconnect layer 620. The insulating layers 611 and 621 can be formed by a method similar to that used to form the insulating layer 111, for example. Further, the via holes 611x are formed in the insulating layer 611, and the via holes 621x are formed in the insulating layer 621. The via holes 611x and 621x can be formed by a method similar to that used to form the via holes 111x, for example.

Next, the interconnect layer 612 is formed on the one surface of the insulating layer 611, and the interconnect layer 622 is formed on the other surface of the insulating layer 621. The interconnect layers 612 and 622 can be formed by a method similar to that used to form the interconnect layer 112, for example.

Next, the insulating layer 613 is formed on the upper surface of the insulating layer 611, so as to cover the interconnect layer 612, and the insulating layer 623 is formed on the lower surface of the insulating layer 621, so as to cover the interconnect layer 622. The insulating layers 613 and 623 can be formed by a method similar to that used to form the insulating layer 111, for example. Further, the via holes 613x are formed in the insulating layer 613, and the via holes 623x are formed in the insulating layer 623. The via holes 613x and 623x can be formed by a method similar to that used to form the via holes 111x, for example.

Next, the interconnect layer 614 is formed on the one surface of the insulating layer 613, and the interconnect layer 624 is formed on the other surface of the insulating layer 623. The interconnect layers 614 and 624 can be formed by a method similar to that used to form the interconnect layer 112, for example.

Next, the solder resist layer 615 is formed on the upper surface of the insulating layer 613, so as to cover the interconnect layer 614. The solder resist layer 615 can be formed by a method similar to that used to form the solder resist layer 125, for example.

Next, by exposing and developing the solder resist layer 615, the openings 615x that expose a part of the upper surface of the interconnect layer 614 are formed in the solder resist layer 615 by photolithography, for example. The openings 615x may be formed by the laser beam machining or the blasting. In this case, a photosensitive material does not need to be used for the solder resist layer 615.

Next, the external connection terminals 616, such as solder bumps or the like, are formed on the upper surface of the interconnect layer 614 exposed at the bottom of the openings 615x. The external connection terminals 616 serve as terminals for making electrical connections to the semiconductor chip.

The large wiring board 600t can be manufactured in the manner described above.

Figure 12A:
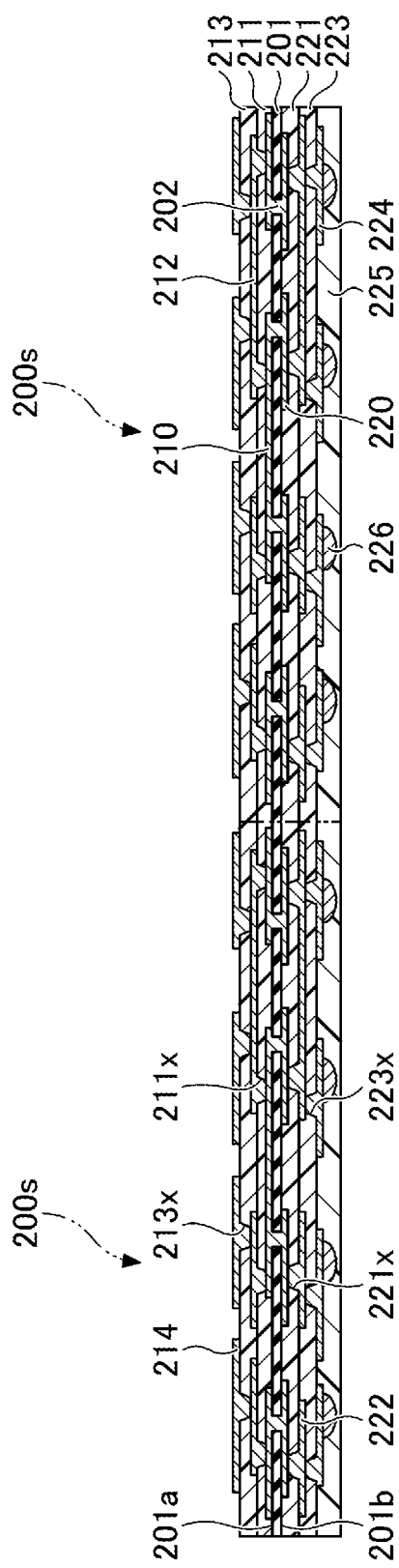
FIG. 12A and FIG. 12B are diagrams (part 7) illustrating the example of the method for manufacturing the laminated wiring board according to the first embodiment.

After manufacturing the large wiring board 200t, the conductive bonding materials 226 are formed on the lower surface of the interconnect layer 224, as illustrated in FIG. 12A. Further, an underfill layer 225 having fluidity is formed on the lower surface of the insulating layer 223, so as to cover the interconnect layer 224 and the conductive bonding materials 226. When forming the underfill layer 225, a film of an epoxy-based resin is laminated on the lower surface of the insulating layer 223, for example, so as to cover the interconnect layer 224 and the conductive bonding materials 226. The underfill layer 225 may be formed by coating a liquid or a paste of the epoxy-based resin on the lower surface of the insulating layer 223 by the screen printing, the roll coating, the spin coating, or the like, for example, so as to cover the interconnect layer 224 and the conductive bonding materials 226. The underfill layer 225 is an example of a third fluid insulating resin layer.

Figure 12B:
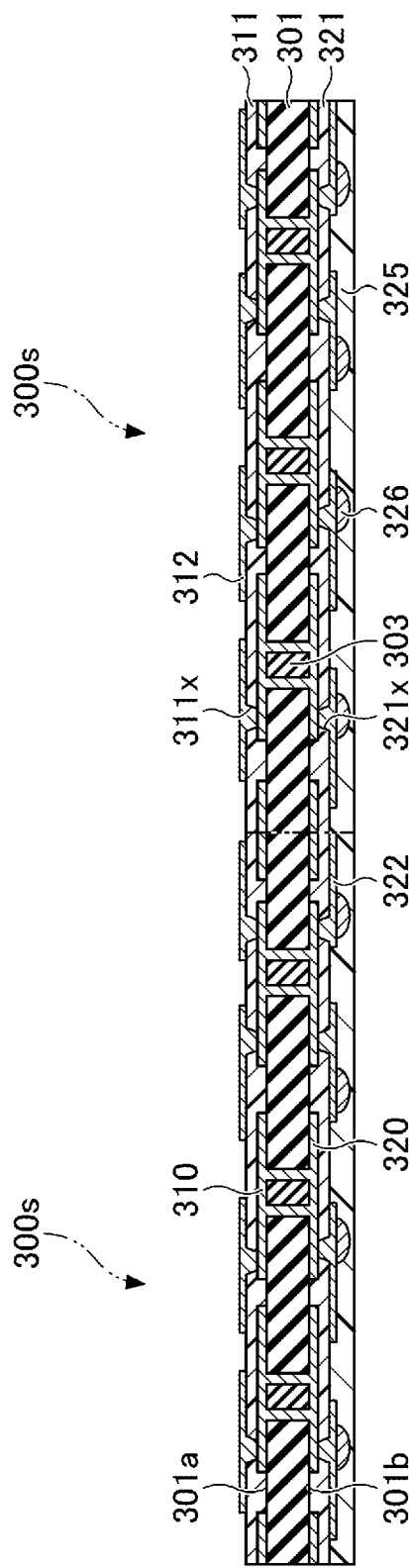

After manufacturing the large wiring board 300t, the conductive bonding materials 326 are formed on the lower surface of the interconnect layer 322, as illustrated in FIG. 12B. Further, an underfill layer 325 having fluidity is formed on the lower surface of the insulating layer 321, so as to cover the interconnect layer 322 and the conductive bonding materials 326. The underfill layer 325 can be formed by a method similar to that used to form the underfill layer 225, for example. The underfill layer 325 is an example of a fourth fluid insulating resin layer.

After manufacturing the large wiring board 400t, the conductive bonding materials 426 are formed on the lower surface of the interconnect layer 424, as illustrated in FIG. 13A. Further, an underfill layer 425 having fluidity is formed on the lower surface of the insulating layer 423, so as to cover the interconnect layer 424 and the conductive bonding materials 426. The underfill layer 425 can be formed by a method similar to that used to form the underfill layer 225, for example. The underfill layer 425 is an example of a first fluid insulating resin layer.

After manufacturing the large wiring board 500t, the conductive bonding materials 526 are formed on the lower surface of the interconnect layer 524, as illustrated in FIG. 13B. Further, an underfill layer 525 having fluidity is formed on the lower surface of the insulating layer 523, so as to cover the interconnect layer 524 and the conductive bonding materials 526. The underfill layer 525 can be formed by a method similar to that used to form the underfill layer 225, for example. The underfill layer 525 is an example of the first fluid insulating resin layer.

Figure 14:
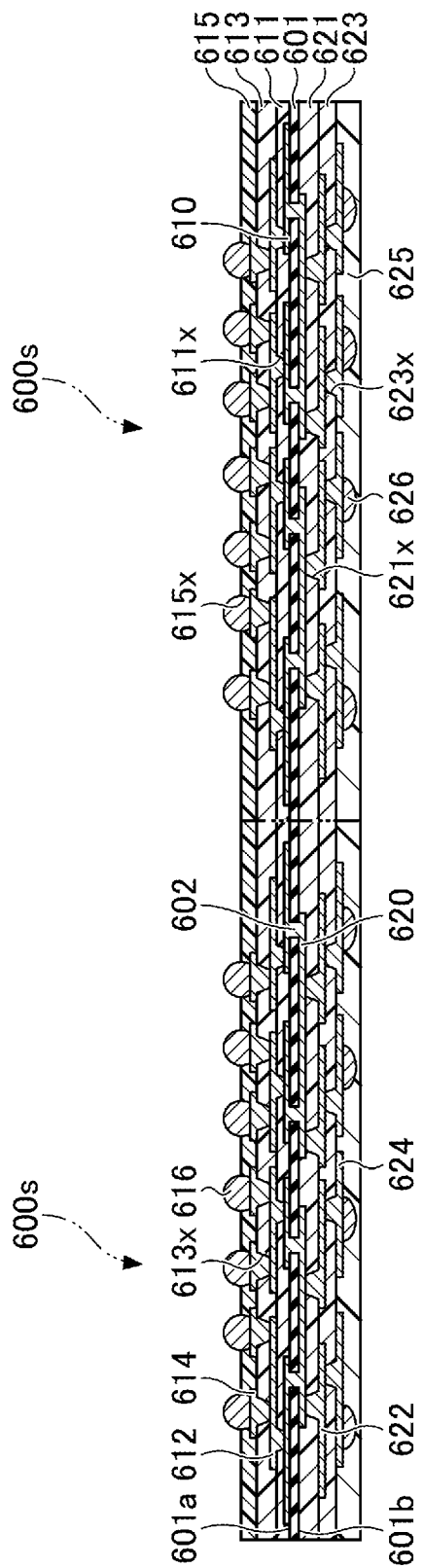
FIG. 14 is a diagram (part 9) illustrating the example of the method for manufacturing the laminated wiring board according to the first embodiment.

After manufacturing the large wiring board 600t, the conductive bonding materials 626 are formed on the lower surface of the interconnect layer 624, as illustrated in FIG. 14. Further, an underfill layer 625 having fluidity is formed on the lower surface of the insulating layer 623, so as to cover the interconnect layer 624 and the conductive bonding materials 626. The underfill layer 625 can be formed by a method similar to that used to form the underfill layer 225, for example. The underfill layer 625 is an example of a second fluid insulating resin layer.

Figure 15:
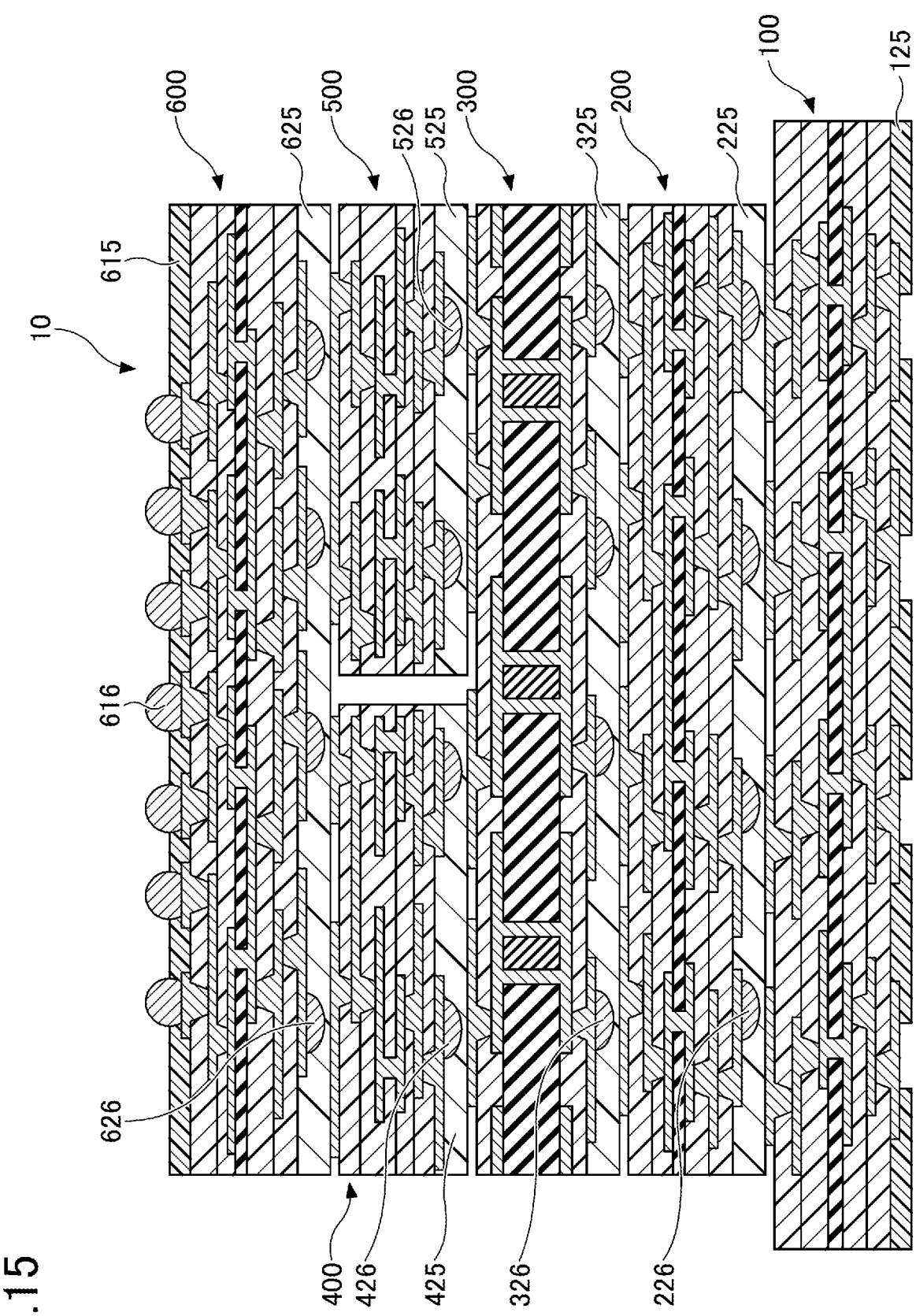
FIG. 15 is a diagram (part 10) illustrating the example of the method for manufacturing the laminated wiring board according to the first embodiment.

Thereafter, as illustrated in FIG. 15, the large wiring board 100t is singulated into individual wiring board regions 100s to obtain a plurality of wiring boards 100. The large wiring board 200t on which the conductive bonding materials 226 and the underfill layer 225 are formed is singulated for each wiring board region 200s to obtain a plurality of wiring boards 200 on which the conductive bonding materials 226 and the underfill layer 225 are formed. The large wiring board 300t on which the conductive bonding materials 326 and the underfill layer 325 are formed is singulated for each wiring board region 300s to obtain a plurality of wiring boards 300 on which the conductive bonding materials 326 and the underfill layer 325 are formed. The large wiring board 400t on which the conductive bonding materials 426 and the underfill layer 425 are formed is singulated for each wiring board region 400s to obtain a plurality of wiring boards 400 on which the conductive bonding materials 426 and the underfill layer 425 are formed. The large wiring board 500t on which the conductive bonding materials 526 and the underfill layer 525 are formed is singulated for each wiring board region 500s to obtain a plurality of wiring boards 500 on which the conductive bonding materials 526 and the underfill layer 525 are formed. The large wiring board 600t on which the conductive bonding materials 626 and the underfill layer 625 are formed is singulated for each wiring board region 600s to obtain a plurality of wiring boards 600 on which the conductive bonding materials 626 and the underfill layer 625 are formed.

Next, the wiring board 100 having predetermined characteristics is selected from the plurality of wiring boards 100, the wiring board 200 having predetermined characteristics is selected from the plurality of wiring boards 200, and the wiring board 300 having predetermined characteristics is selected from the plurality of wiring boards 300. In addition, the wiring board 400 having predetermined characteristics is selected from the plurality of wiring boards 400, the wiring board 500 having predetermined characteristics is selected from the plurality of wiring boards 500, and the wiring board 600 having predetermined characteristics is selected from the plurality of wiring boards 600. Then, the selected wiring boards 200 and 300 having the predetermined characteristics are successively laminated on the selected wiring board 100 having the predetermined characteristics, the selected wiring boards 400 and 500 having the predetermined characteristics are arranged side by side and laminated on the selected wiring board 300, and the selected wiring board 600 having the predetermined characteristics is laminated on the selected wiring boards 400 and 500, to thereby obtain a laminated body 10. Determining whether or not each wiring board has the predetermined characteristics may be performed before or after the singulation. However, when forming the laminated body 10, non-defective products (wiring boards having the predetermined characteristics) are selected, and the non-defective products are combined with one another.

Figure 16:
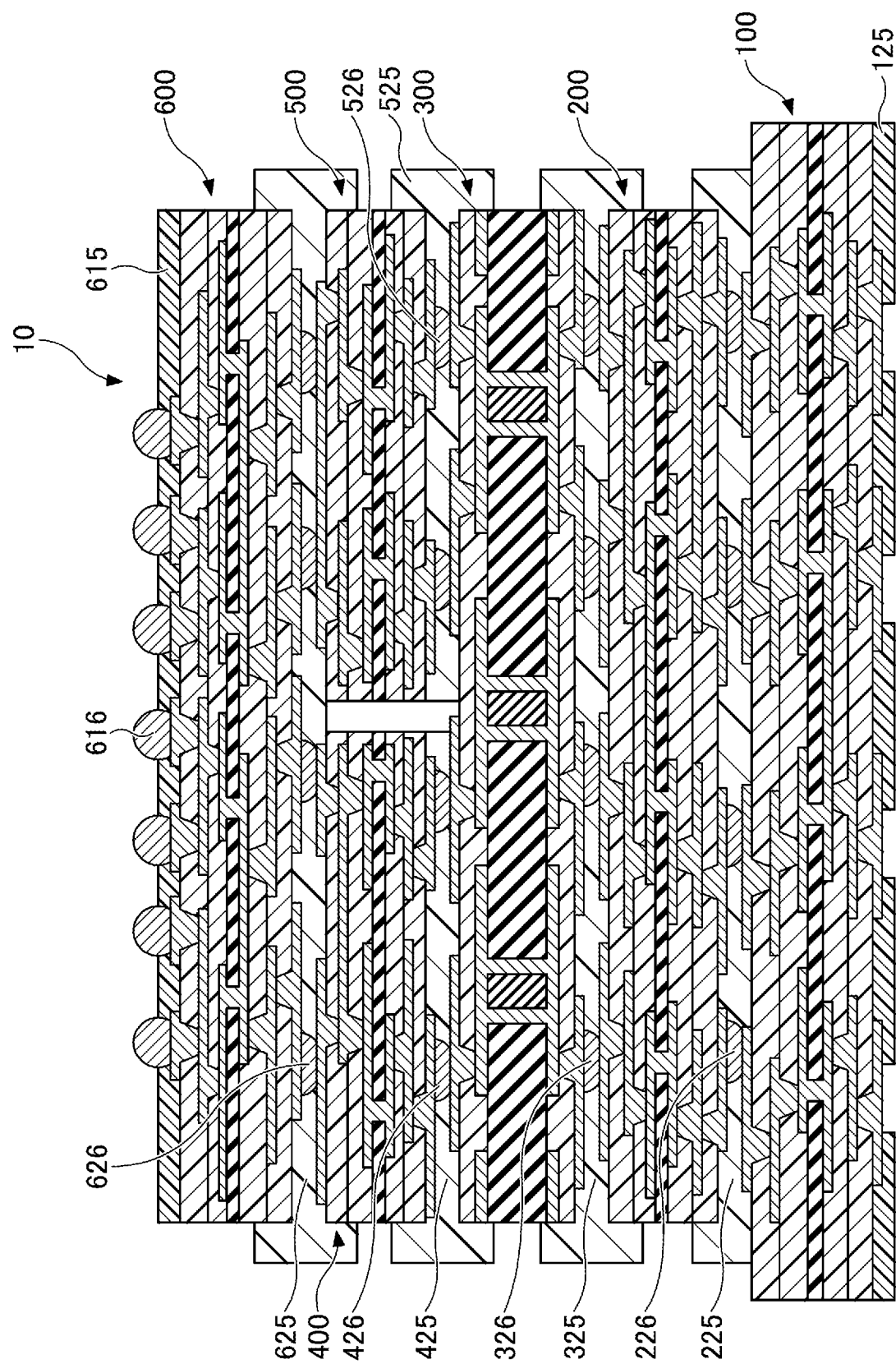
FIG. 16 is a diagram (part 11) illustrating the example of the method for manufacturing the laminated wiring board according to the first embodiment.

Next, the laminated body 10 is subjected to a temporary compression bonding. In the temporary compression bonding, the laminated body 10 is heated while applying pressure from above and below the laminated body 10. As a result, as illustrated in FIG. 16, the underfill layers 225, 325, 425, 525, and 625 are compressed and protrude from the side surfaces of the laminated body of the wiring boards 200, 300, 400, 500, and 600. Further, the conductive bonding materials 226, 326, 426, 526, and 626 are also compressed.

Figure 17:
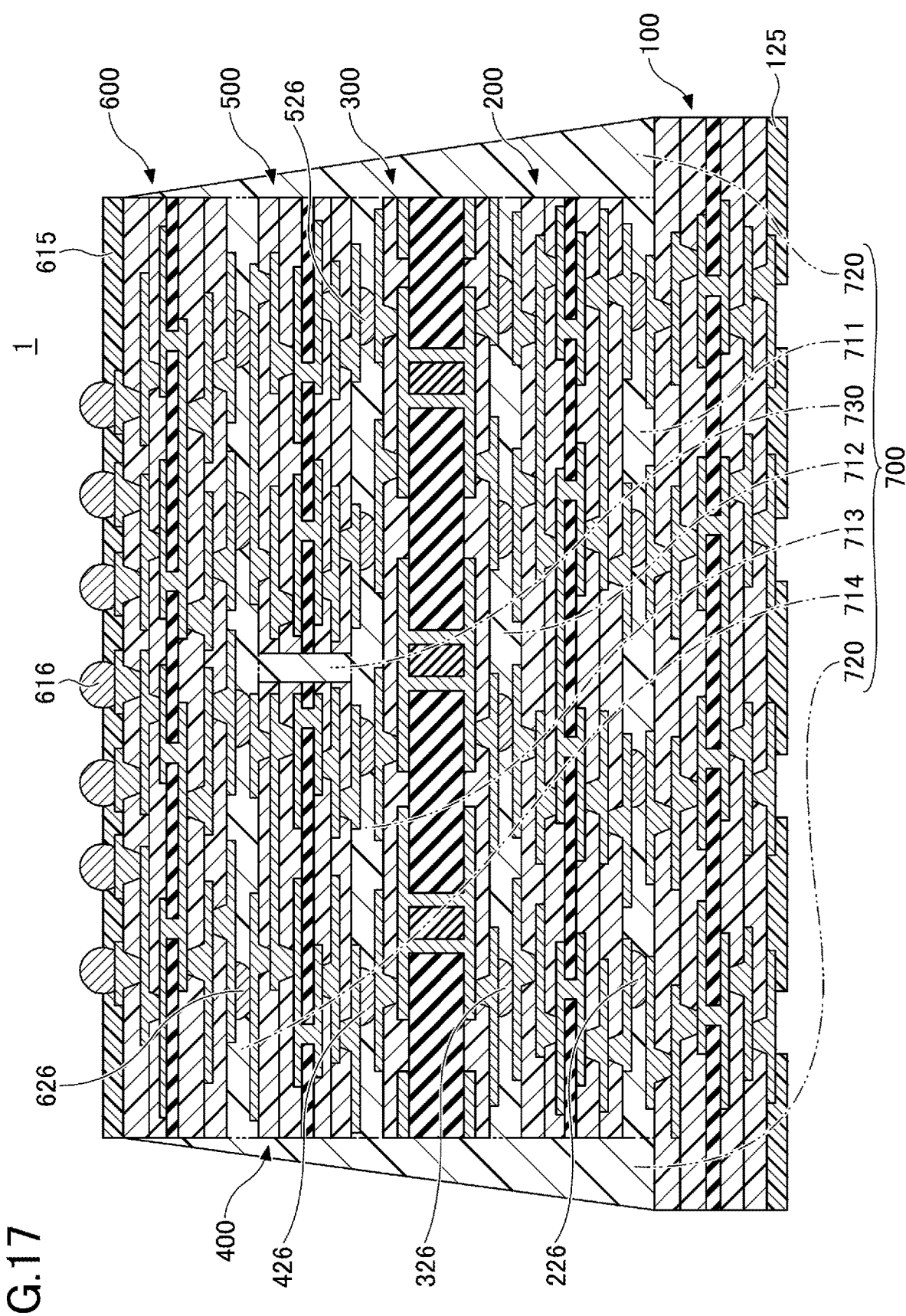
FIG. 17 is a diagram (part 12) illustrating the example of the method for manufacturing the laminated wiring board according to the first embodiment.

Next, the laminated body 10 is subjected to a main compression bonding. In the main compression bonding, the laminated body 10 is heated while applying pressure from above, below, and the side of the laminated body 10, in a state where the laminated body 10 is covered from above with a diaphragm rubber. As a result, as illustrated in FIG. 17, the underfill layers 225, 325, 425, 525, and 625 are further compressed, and the portions protruding from the side surfaces of the laminated body of the wiring boards 200, 300, 400, 500, and 600 are integrated and unified on the inner side of the diaphragm rubber. In addition, the underfill layers 425, 525, and 625 spread into a gap between the wiring board 400 and the wiring board 500, and are integrated and unified with one another. As a result, the insulating resin layer 700, including the adhesive portions 711, 712, 713, and 714, the side surface covering portion 720, and the adhesive portion 730, is formed.

Moreover, in the main compression bonding, the conductive bonding materials 226, 326, 426, 526, and 626 are melted and solidified. As a result, the wiring board 100 and the wiring board 200 are mechanically bonded to each other by the conductive bonding materials 226, the wiring board 200 and the wiring board 300 are mechanically bonded to each other by the conductive bonding materials 326, the wiring board 300 and the wiring board 400 are mechanically bonded to each other by the conductive bonding materials 426, the wiring board 300 and the wiring board 500 are mechanically bonded to each other by the conductive bonding materials 526, and the wiring boards 400 and 500 and the wiring board 600 are mechanically bonded to one another by the conductive bonding materials 626.

The laminated wiring board 1 according to the first embodiment can be manufactured in the manner described above.

The laminated wiring board 1 includes a plurality of interconnect layers. When forming the interconnect layers, a portion that does not satisfy the predetermined characteristics may be generated. Accordingly, as the number of interconnect layers formed on the large wiring board including a plurality of wiring board regions increases, the number of wiring boards having the predetermined characteristics among the plurality of wiring boards formed from the large wiring board decreases.

In the present embodiment, the number of interconnect layers included in the laminated wiring board 1 is 28, but the number of interconnect layers included in each of the large wiring boards 100t, 200t, 400t, 500t, and 600t is 6, and the number of interconnect layers included in the large wiring board 300t is 4. For this reason, it is possible to considerably improve the yield compared to a case where the large wiring board including 28 interconnect layers is manufactured by the build-up method.

In addition, the wiring boards 400 and 500 are arranged side by side between the wiring board 300 and the wiring board 600. By including in the wiring board 400 or 500 a part where the yield tends to become relatively low in the laminated wiring board 1, it is possible to reduce a decrease in the yield of the entire laminated wiring board 1. For example, the wiring boards 400 and 500 may include micro-interconnects, and the wiring boards 400 and 500 may include components therein.

Moreover, when compared to the case where the large wiring board including 28 interconnect layers is used, the proportion of defects generated from each large wiring board is low, and it is thus possible to increase the number of laminated wiring boards 1 having predetermined characteristics that can be manufactured per unit time, such as one month, for example. That is, the throughput can be improved.

Further, the lead time can be shortened by performing at least a part of the manufacturing processes of the large wiring boards 100t, 200t, 300t, 400t, 500t, and 600t in parallel.

In the present embodiment, the side surface covering portion 720 covers the side surfaces of the wiring boards 200, 300, 400, 500, and 600. For this reason, it is possible to reduce delamination of the wiring boards from one another, and to reduce delamination of the insulating layer and the interconnect layer in each of the wiring boards. For example, the temperature of the laminated wiring board 1 may increase when the semiconductor chip is mounted on the laminated wiring board 1, or during the use of the laminated wiring board 1. Further, the laminated wiring board 1 may be heated during a reliability test. When the temperature of the laminated wiring board 1 rises, a thermal stress may be generated in the laminated wiring board 1. In the present embodiment, even if the thermal stress is generated, the delamination caused by the thermal stress can be reduced.

Melting points of the conductive bonding materials 226, 326, 426, 526, and 626 are preferably lower than a melting point of the external connection terminals 616. This is because the conductive bonding materials 226, 326, 426, 526, and 626 can be melted without melting the external connection terminals 616 during the main compression bonding. In a case where the melting point of the external connection terminals 616 is lower than or equal to the melting points of the conductive bonding materials 226, 326, 426, 526, and 626, for example, the external connection terminals 616 can be formed after the main compression bonding.

The outer edges of the wiring boards 200, 300, and 600 do not need to overlap one another in the plan view, and the outer edges of the wiring boards 200, 300, and 600 may be deviated from one another. Similarly, the outer edges of the wiring boards 400 and 500 do not need to partially overlap the outer edges of the wiring boards 200, 300, and 600 in the plan view, and the outer edges of the wiring boards 400 and 500 may be deviated from the outer edges of the wiring boards 200, 300, and 600. Even in such cases, the outer edges of the wiring boards 200, 300, 400, 500, and 600 are preferably located inside the outer edge of the wiring board 100 in the plan view, because it becomes easier to stably form the side surface covering portion 720.

Second Embodiment

Figure 18:
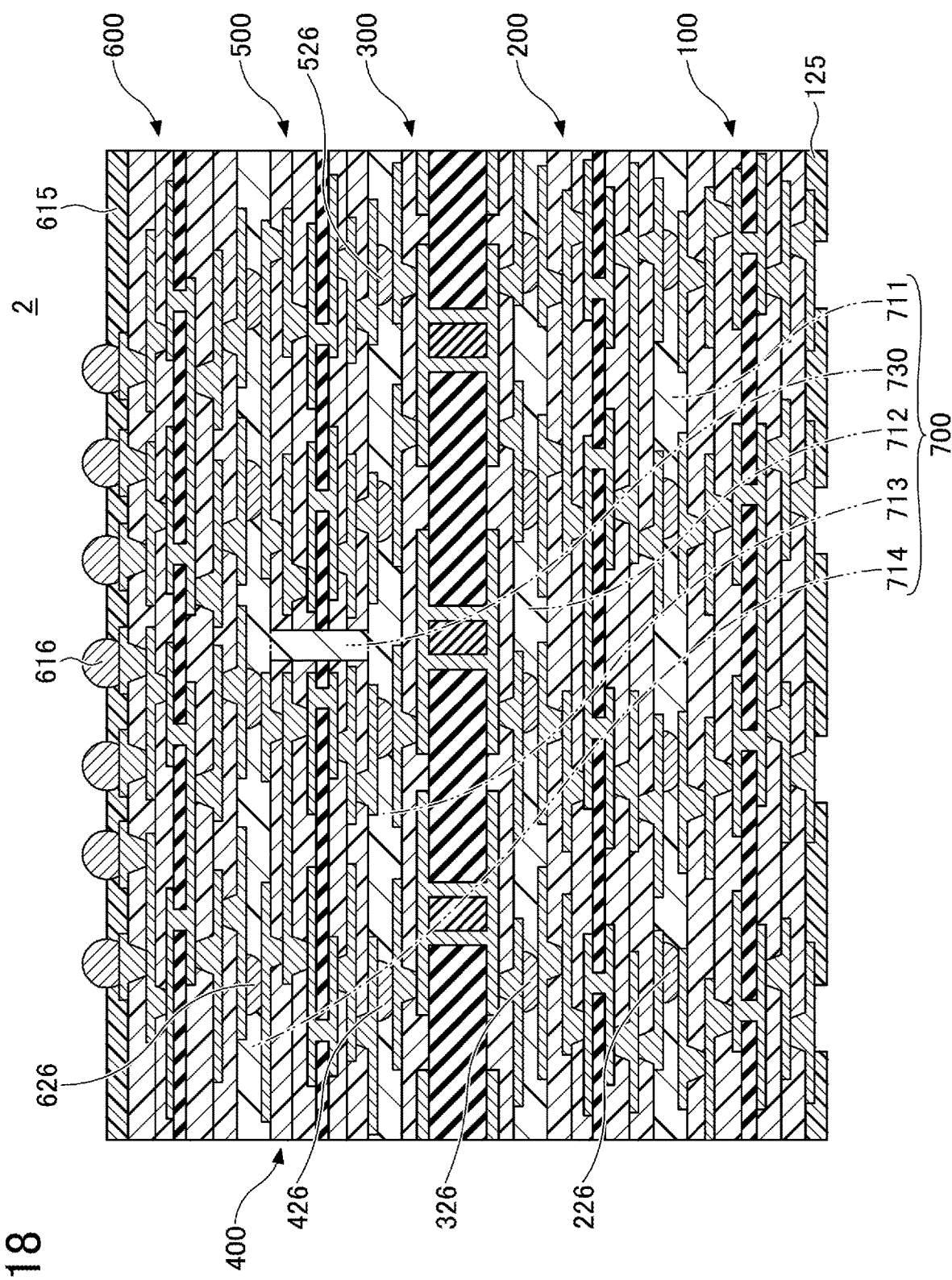
FIG. 18 is a cross sectional view illustrating an example of the laminated wiring board according to a second embodiment.

<Configuration of Laminated Wiring Board>
Next, a second embodiment will be described.
FIG. 18 is a cross sectional view illustrating an example of the laminated wiring board according to the second embodiment.

As illustrated in FIG. 18, in a laminated wiring board 2 according to the second embodiment, the outer edge of the wiring board 100 overlaps the outer edges of the wiring boards 200, 300, and 600 in the plan view. In addition, the insulating resin layer 700 includes the adhesive portions 711, 712, 713, 714, and 730 as in the first embodiment, but does not include the side surface covering portion 720 unlike the first embodiment.

Other configurations of the second embodiment are the same as those of the first embodiment.
<Method for Manufacturing Laminated Wiring Board>
When manufacturing the laminated wiring board 2 according to the second embodiment, the laminated wiring board 1 according to the first embodiment is manufactured, and the side surface covering portion 720 and the portions protruding from the wiring boards 200, 300, and 600 in the plan view of the wiring board 100 are thereafter removed by grinding or the like, for example.

According to the second embodiment, it is possible to obtain the effect of improving the yield, similar to the first embodiment.

Third Embodiment

Figure 19:
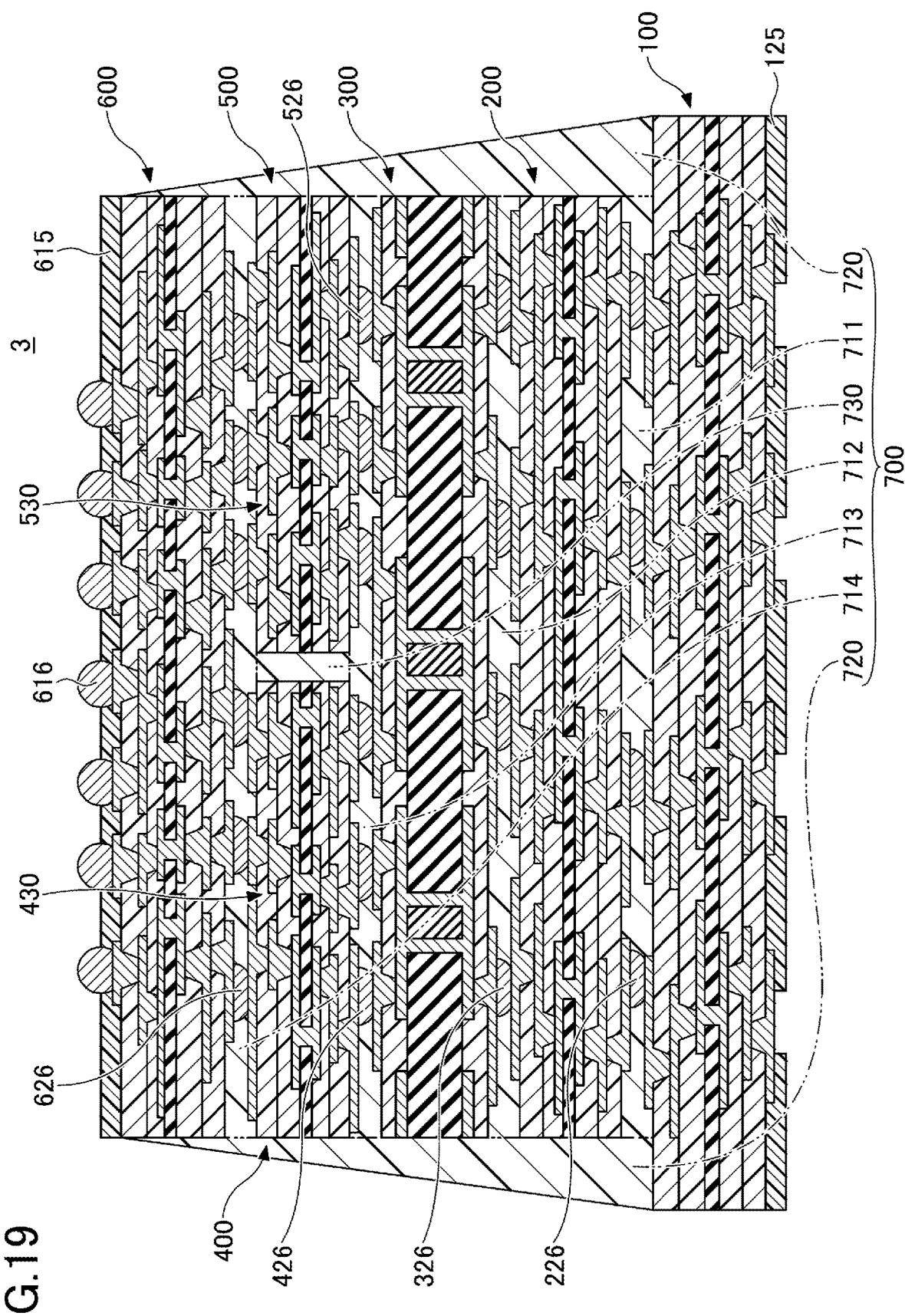
FIG. 19 is a cross sectional view illustrating an example of the laminated wiring board according to a third embodiment.

Next, a third embodiment will be described. FIG. 19 is a cross sectional view illustrating an example of the laminated wiring board according to the third embodiment.

As illustrated in FIG. 19, in a laminated wiring board 3 according to the third embodiment, the wiring board 400 includes micro-interconnects 430, the wiring board 500 includes micro-interconnects 530, and a wiring density in the wiring boards 400 and 500 is higher than a wiring density in the first embodiment. The term "micro-interconnects" as used herein refers to interconnects forming a line-and-space (L/S) pattern having a pattern width and a distance between patterns of less than 20 lam. The wiring board 600 may also include micro-interconnects.

Other configurations of the third embodiment are the same as those of the first embodiment.

According to the third embodiment, it is possible to obtain effects similar to those obtainable in the first embodiment.

Fourth Embodiment

Figure 20:
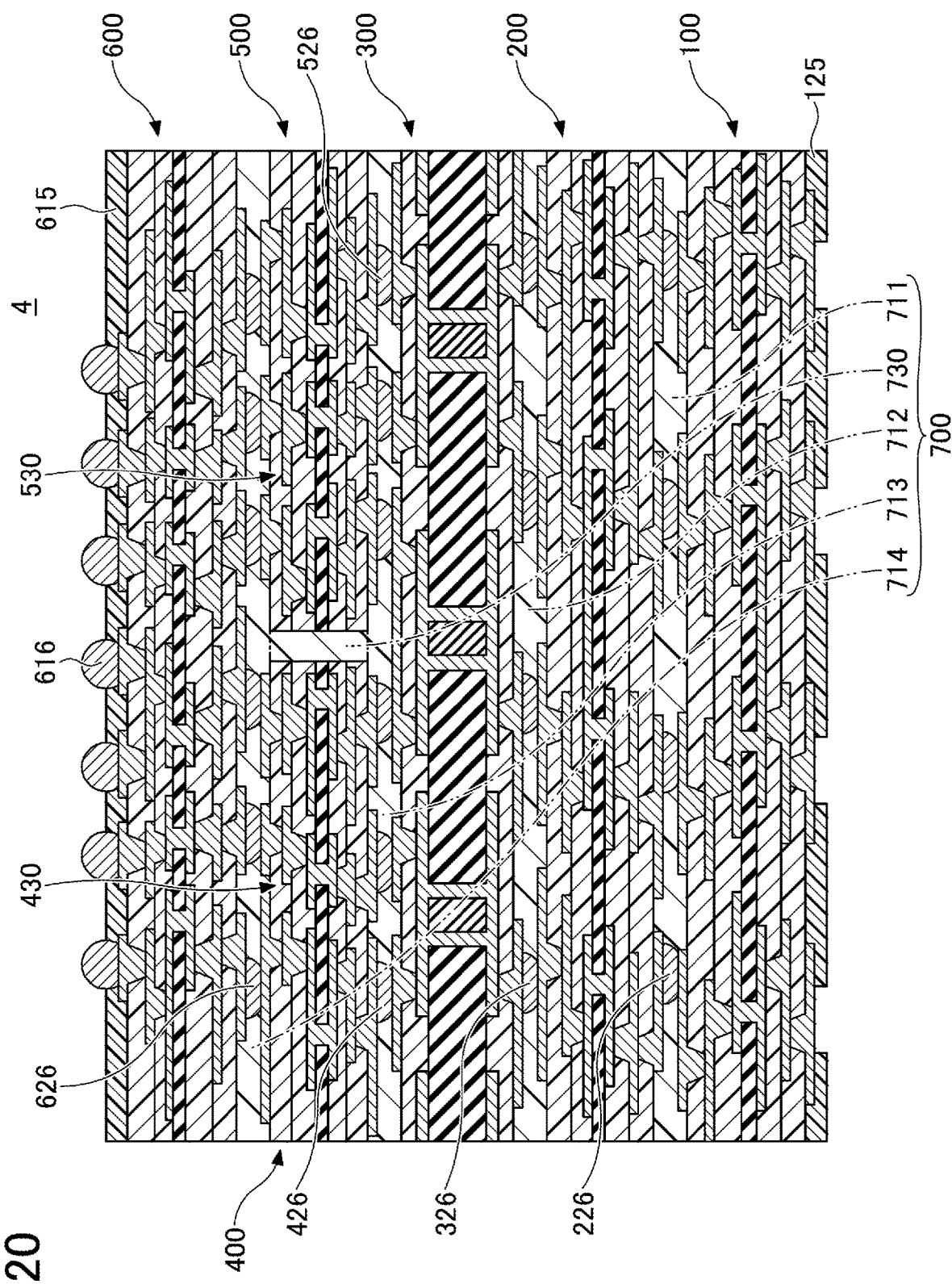
FIG. 20 is a cross sectional view illustrating an example of the laminated wiring board according to a fourth embodiment.

<Configuration of Laminated Wiring Board>
Next, a fourth embodiment will be described. FIG. 20 is a cross sectional view illustrating an example of the laminated wiring board according to the fourth embodiment.

As illustrated in FIG. 20, in a laminated wiring board 4 according to the fourth embodiment, the outer edge of the wiring board 100 overlaps the outer edges of the wiring boards 200, 300, and 600 in the plan view. In addition, the insulating resin layer 700 includes the adhesive portions 711, 712, 713, 714, and 730 as in the third embodiment, but does not include the side surface covering portion 720 unlike the third embodiment.

Other configurations of the fourth embodiment are the same as those of the third embodiment.

<Method for Manufacturing Laminated Wiring Board>

When manufacturing the laminated wiring board 4 according to the fourth embodiment, the laminated wiring board 3 according to the third embodiment is manufactured, and the side surface covering portion 720 and the portions protruding from the wiring boards 200, 300, and 600 in the plan view of the wiring board 100 are removed by grinding or the like, for example.

According to the fourth embodiment, it is possible to obtain the effect of improving the yield, similar to the third embodiment.

Fifth Embodiment

<Configuration of Laminated Wiring Board>

Figure 21:
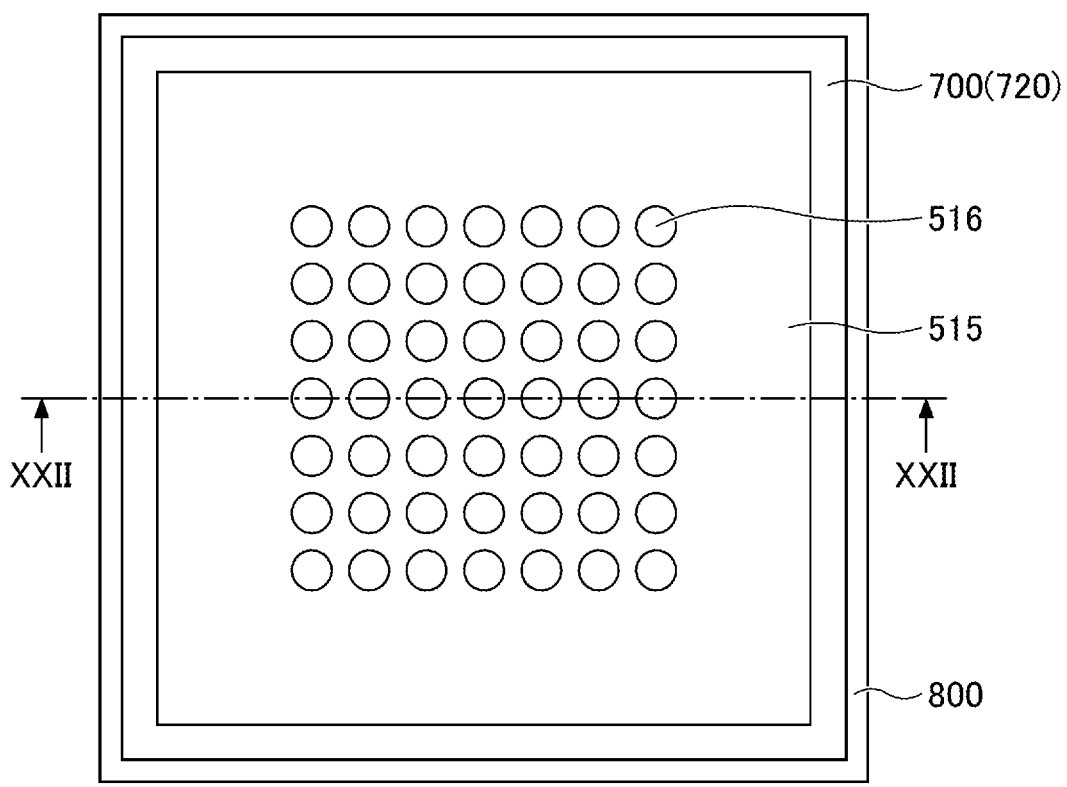
FIG. 21 is a top view illustrating an example of the laminated wiring board according to a fifth embodiment.
Figure 22:
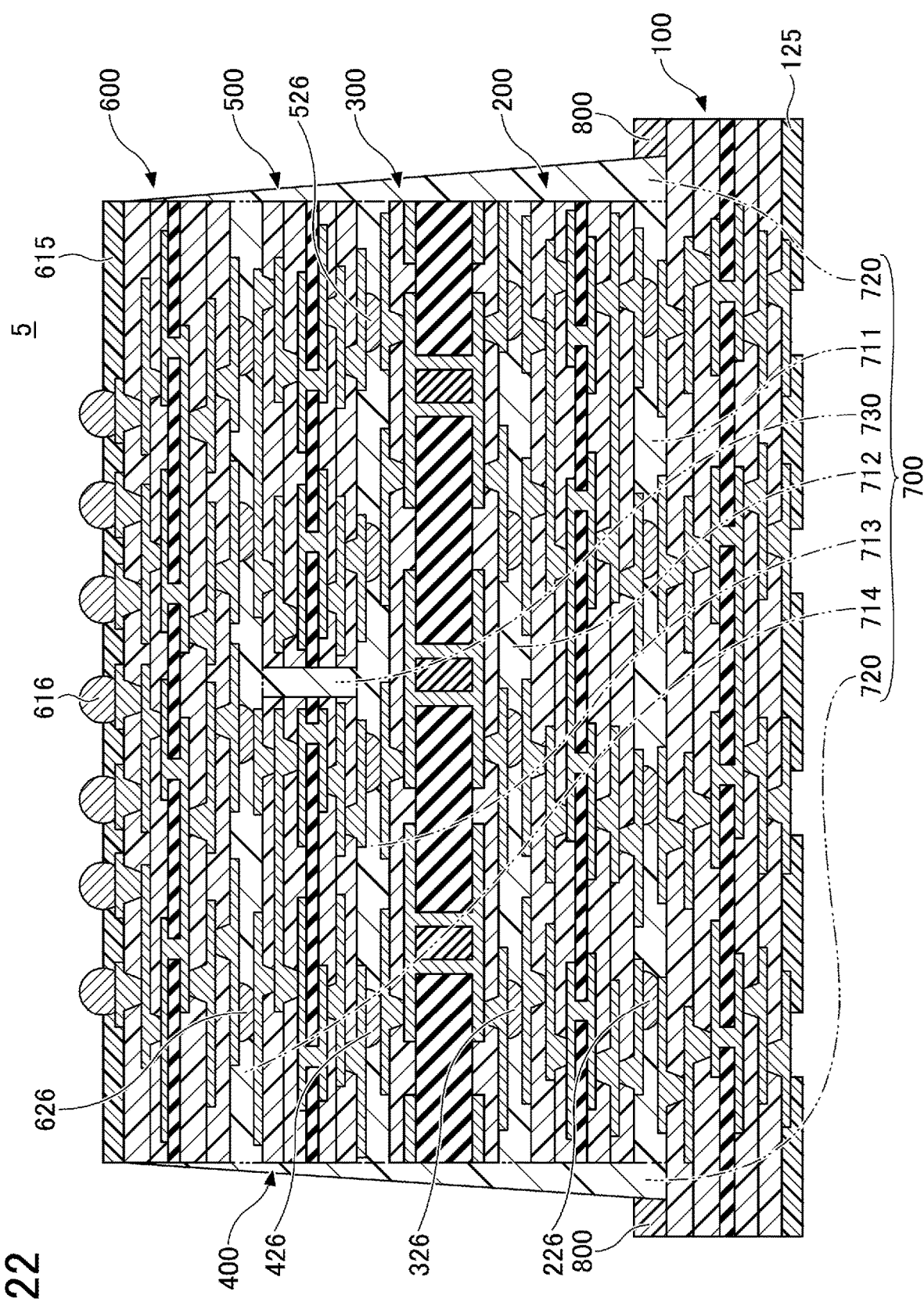
FIG. 22 is a cross sectional view illustrating the example of the laminated wiring board according to the fifth embodiment.

Next, a fifth embodiment will be described. FIG. 21 is a top view illustrating an example of the laminated wiring board according to the fifth embodiment. FIG. 22 is a cross sectional view illustrating the example of the laminated wiring board according to the fifth embodiment. FIG. 22 corresponds to a cross sectional view along a line XXII-XXII in FIG. 21.

As illustrated in FIG. 21 and FIG. 22, a laminated wiring board 5 according to the fifth embodiment includes a resin outflow restriction member 800 provided on the wiring board 100 and surrounding the side surface covering portion 720 in the plan view. Similar to the first embodiment, the side surface covering portion 720 covers the side surface of the wiring board 200, the side surface of the wiring board 300, the side surface of the wiring board 400, and the side surface of the wiring board 500. In the plan view, an outer edge of the side surface covering portion 720 is in contact with the resin outflow restriction member 800. A material used for the resin outflow restriction member 800 may be an epoxy-based resin or solder resist, for example.

Other configurations of the fifth embodiment are the same as those of the first embodiment.

<Method for Manufacturing Laminated Wiring Board>

When manufacturing the laminated wiring board 5 according to the fifth embodiment, the resin outflow restriction member 800 is formed on the wiring board 100, surrounding a region where the wiring boards 200, 300, 400, 500, and 600 are laminated, so as to be separated from the region in the plan view, before forming the laminated body 10, such as before the temporary compression bonding, for example. The resin outflow restriction member 800 can be formed by curing a photoresist, for example.

Other processes performed to manufacture the fifth embodiment are the same as those performed to manufacture the first embodiment.

In the fifth embodiment, the resin outflow restriction member 800 is formed before the laminated body 10 is compression bonded. For this reason, an outflow range of the underfill layers 225, 325, 425, 525, and 625 during the compression bonding is restricted, and it is possible to more easily obtain a stable shape of the side surface covering portion 720.

Sixth Embodiment

Figure 23:
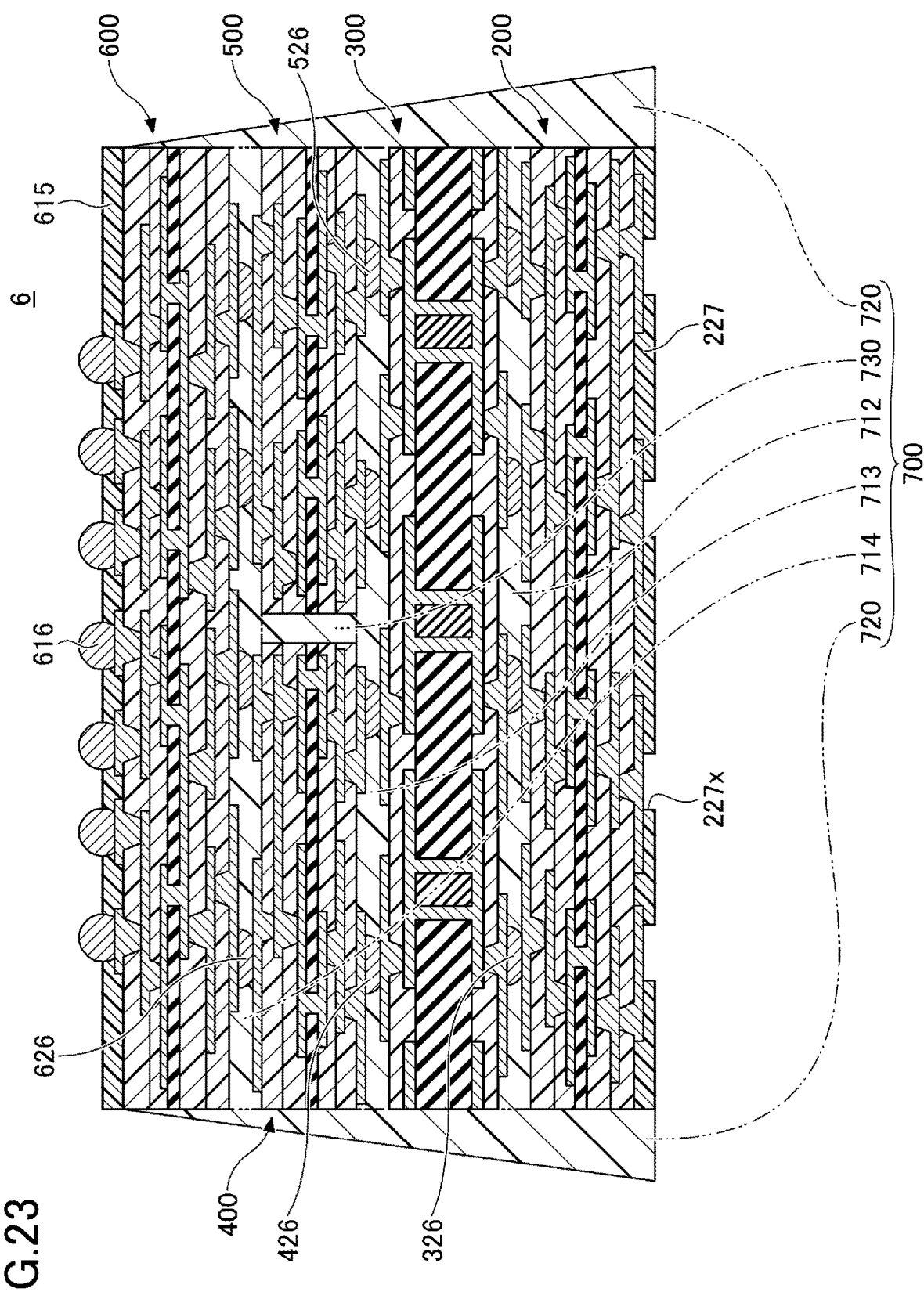
FIG. 23 is a cross sectional view illustrating an example of the laminated wiring board according to a sixth embodiment.

Next, a sixth embodiment will be described. FIG. 23 is a cross sectional view illustrating an example of the laminated wiring board according to a sixth embodiment.

As illustrated in FIG. 23, a laminated wiring board 6 according to the sixth embodiment does not include the wiring board 100, and the wiring board 200 includes a solder resist layer 227. The solder resist layer 227 is the outermost layer on the other surface of the wiring board 200, and is an insulating layer provided on the lower surface of the insulating layer 223 so as to cover the interconnect layer 224. A material used for the solder resist layer 227 and a thickness of the solder resist layer 227 may be the same as those of the solder resist layer 125, for example.

The solder resist layer 227 has openings 227x, and a part of the lower surface of the interconnect layer 224 is exposed at the bottom of the openings 227x. The planar shape of the openings 227x is a circular shape, for example. The interconnect layer 224 exposed inside the openings 227x can be used as pads for making electrical connections to the mounting substrate, such as the mother board or the like. A metallic layer may be formed on the lower surface of the interconnect layer 224 exposed inside the openings 227x, or the pads may be subjected to an anti-oxidation treatment, such as the OSP treatment or the like, as required.

The insulating resin layer 700 may not include the adhesive portion 711, and the side surface covering portion 720 may cover a side surface of the solder resist layer 227.

According to the sixth embodiment, it is possible to obtain effects similar to those obtainable in the first embodiment.

In the present disclosure, the number of wiring boards included in the laminated wiring board is not particularly limited, as long as the number is two or greater. Further, the number of interconnect layers included in each wiring board is also not particularly limited.

According to the disclosed technique, it is possible to reduce deterioration of the yield.

Various aspects of the subject-matter described herein may be set out non-exhaustively in the following numbered clauses:

1. A method for manufacturing a laminated wiring board, comprising:

forming a first wiring board, a plurality of second wiring boards, and a third wiring board;

forming a laminated body by laminating the plurality of second wiring boards on the first wiring board while providing a first fluid insulating resin layer therebetween, and laminating the third wiring board on the plurality of second wiring boards while providing a second fluid insulating resin layer therebetween; and compression bonding the laminated body, wherein the compression bonding includes forming a first insulating resin layer disposed between the first wiring board and the plurality of second wiring boards using the first fluid insulating resin layer; and forming a second insulating resin layer disposed between the plurality of second wiring boards and the third wiring board using the second fluid insulating resin layer.

2. The method for manufacturing the laminated wiring board according to clause 1, wherein the compression bonding includes forming a third insulating resin layer covering a side surface of the first wiring board, side surfaces of the plurality of second wiring boards, and a side surface of the third wiring board using the first fluid insulating resin layer and the second fluid insulating resin layer.

3. The method for manufacturing the laminated wiring board according to clause 1 or 2, further comprising:

forming a fourth wiring board, wherein
the forming the laminated body includes laminating the first wiring board on the fourth wiring board while providing a third fluid insulating resin layer therebetween, and
the compression bonding includes forming a fourth insulating resin layer disposed between the fourth wiring board and the first wiring board using the third fluid insulating resin layer.

4. The method for manufacturing the laminated wiring board according to clause 3, further comprising:

forming a resin outflow restriction member on the fourth wiring board, surrounding a region where the first wiring board is laminated, so as to be separated from the region in a plan view, before the compression bonding.

5. The method for manufacturing the laminated wiring board according to clause 1 or 2, wherein the forming the first wiring board forms a plurality of first wiring boards, and
the forming the laminated body includes laminating the plurality of the first wiring boards on one another while providing a fourth fluid insulating resin layer therebetween.

Although the embodiments are numbered with, for example, "first," "second," "third," "fourth," "fifth," or "sixth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A laminated wiring board comprising: a first wiring board: a plurality of second wiring boards that are physically and electrically discrete and spaced apart side by side along a first direction, the plurality of second wiring boards being laminated on the first wiring board in a second direction perpendicular to the first direction; a third wiring board laminated on the plurality of second wiring boards in the second direction; a first insulating resin layer disposed between the first wiring board and the plurality of second wiring boards; and a second insulating resin layer disposed between the plurality of second wiring boards and the third wiring board, wherein the first wiring board and each second wiring board of the plurality of second wiring boards respectively have a configuration including alternately laminated insulating layers and interconnect layers.

2. The laminated wiring board as claimed in claim 1, further comprising:

a third insulating resin layer covering a side surface of the first wiring board, side surfaces of the plurality of second wiring boards, and a side surface of the third wiring board.

3. The laminated wiring board as claimed in claim 1, further comprising:

a first conductive bonding material configured to bond the first wiring board and the plurality of second wiring boards; and
a second conductive bonding material configured to bond the plurality of second wiring boards and the third wiring board.

4. The laminated wiring board as claimed in claim 1, further comprising:

a fourth wiring board, wherein the first wiring board is laminated on the fourth wiring board in the second direction; and
a fourth insulating resin layer disposed between the first wiring board and the fourth wiring board.

5. The laminated wiring board as claimed in claim 1, further comprising:

a fourth wiring board, wherein the first wiring board is laminated on the fourth wiring board in the second direction;
a third insulating resin layer covering the side surface of the first wiring board, side surfaces of the plurality of second wiring boards, and the side surface of the third wiring board; and
a fourth insulating resin layer disposed between the first wiring board and the fourth wiring board,
wherein the first insulating resin layer, the second insulating resin layer, the third insulating resin layer, and the fourth insulating resin layer are integrated and unified.

6. The laminated wiring board as claimed in claim 1, wherein the second wiring board includes a line-and-space pattern having a pattern width and a distance between patterns of less than 20 μm.

7. The laminated wiring board as claimed in claim 1, further comprising:

a plurality of first wiring boards laminated on one another in the second direction, and
a fifth insulating resin layer disposed between the plurality of first wiring boards.

8. The laminated wiring board as claimed in claim 1, wherein side surfaces of two mutually adjacent second wiring boards adjacent in the first direction, among the plurality of second wiring boards, oppose each other.

9. The laminated wiring board as claimed in claim 1, wherein side surfaces of at least one pair of adjacent second wiring boards adjacent to each other in the first direction, among the plurality of second wiring boards, oppose each other.

10. The laminated wiring board as claimed in claim 1, further comprising:

a third insulating resin layer covering a side surface of the first wiring board, side surfaces of the plurality of second wiring boards, and a side surface of the third wiring board,
wherein the third insulating resin layer is inclined from the third wiring board towards the first wiring board, such that a thickness of the insulating resin layer in a side view thereof increases from the third wiring board towards the first wiring board.

11. The laminated wiring board as claimed in claim 1, further comprising:

a fourth wiring board, wherein:
the first wiring board is laminated on the fourth wiring board in the second direction, and
in a plan view, outer edges of the first wiring board, the second wiring board, and the third wiring board are located inside an outer edge of the fourth wiring board.

12. The laminated wiring board as claimed in claim 1, wherein:
- the first wiring board is a single board that is physically discrete from the plurality of second wiring boards,
- the first insulating resin layer includes a first adhesive, and a plurality of first conductive bonding materials embedded in the first insulating resin layer,
- each second wiring board of the plurality of second wiring boards is adhered to the first wiring board via the first adhesive and the plurality of first conductive bonding materials of the first insulating resin layer, to mechanically bond and electrically connect each second wiring board of the plurality of second wiring boards to the first wiring board,
- the third wiring board is a single board that is physically discrete from the plurality of second wiring boards,
- the second insulating resin layer includes a second adhesive, and a plurality of second conductive bonding materials embedded in the second insulating resin layer, and
- the third wiring board is adhered to each second wiring board of the plurality of second wiring boards via the second adhesive and the plurality of second conductive bonding materials of the second insulating resin layer, to mechanically bond and electrically connect the third wiring board to each second wiring board of the plurality of second wiring boards.

13. The laminated wiring board as claimed in claim 1, wherein the third wiring board has a configuration including alternately laminated insulating layers and interconnect layers.

14. The laminated wiring board as claimed in claim 2, wherein the first insulating resin layer, the second insulating resin layer, and the third insulating resin layer are integrated and unified.

15. The laminated wiring board as claimed in claim 2, wherein the third insulating resin layer completely covers the side surface of the first wiring board, the side surfaces of the plurality of second wiring boards, and the side surface of the third wiring board.

16. The laminated wiring board as claimed in claim 4, further comprising:
- a third conductive bonding material configured to bond the first wiring board and the fourth wiring board.

17. The laminated wiring board as claimed in claim 5, further comprising:
- a resin outflow restriction member provided on the fourth wiring board and surrounding the second insulating resin layer in a plan view.

* * * * *